US009985609B2

(12) United States Patent
Montgomery et al.

(10) Patent No.: US 9,985,609 B2
(45) Date of Patent: May 29, 2018

(54) CUSTOMIZABLE DATA AGGREGATING, DATA SORTING, AND DATA TRANSFORMATION SYSTEM

(71) Applicants: Craig S. Montgomery, Sarasota, FL (US); Spence K. Purnell, Tallahassee, FL (US)

(72) Inventors: Craig S. Montgomery, Sarasota, FL (US); Spence K. Purnell, Tallahassee, FL (US)

(*) Notice: Subject to any disclaimer, the term of this patent is extended or adjusted under 35 U.S.C. 154(b) by 0 days. days.

(21) Appl. No.: 15/401,711

(22) Filed: Jan. 9, 2017

(65) Prior Publication Data

US 2017/0201237 A1 Jul. 13, 2017

Related U.S. Application Data

(60) Provisional application No. 62/276,002, filed on Jan. 7, 2016.

(51) Int. Cl.
| | |
|---|---|
| *G06F 17/10* | (2006.01) |
| *H03H 21/00* | (2006.01) |
| *G06F 17/30* | (2006.01) |
| *G06F 7/24* | (2006.01) |
| *G06F 17/17* | (2006.01) |

(52) U.S. Cl.
CPC .......... *H03H 21/0012* (2013.01); *G06F 7/24* (2013.01); *G06F 17/17* (2013.01); *G06F 17/3053* (2013.01); *G06F 17/30569* (2013.01)

(58) Field of Classification Search
CPC ....... H03H 21/0012; G06F 7/24; G06F 17/17; G06F 17/3053; G06F 17/30569

USPC ........................................................ 708/300
See application file for complete search history.

(56) References Cited

U.S. PATENT DOCUMENTS

| | | | |
|---|---|---|---|
| 7,944,472 | B2 | 5/2011 | Brown |
| 8,070,654 | B2 | 12/2011 | Chapa, Jr. et al. |
| 8,083,646 | B2 | 12/2011 | Chapa, Jr. et al. |
| 8,128,410 | B2 | 3/2012 | Prstojevich |
| 8,287,435 | B2 | 10/2012 | Chapa, Jr. et al. |
| 8,292,788 | B2 | 10/2012 | Chapa, Jr. et al. |

(Continued)

OTHER PUBLICATIONS

NCSA Athletic Recruiting, "Sports Specific Recruiting Guide," Jun. 2010, document of 59 pages.

(Continued)

*Primary Examiner* — Tan V. Mai
(74) *Attorney, Agent, or Firm* — Akerman LLP; Mammen (Roy) P. Zachariah, Jr.

(57) ABSTRACT

A customizable data aggregating, data sorting, and data transformation system is disclosed. In particular, the system may allow for the application of various filters to a sample of data corresponding to various measurables associated with objects. A mean and standard deviation for each of the measurables in the filtered sample of data may be calculated and may be utilized in determining z-scores for a first set of raw measurements corresponding to the measurables. Once the z-scores for the first set of raw measurements are determined, selected weights may be applied to each of the z-scores to determine a weighted z-score for each of the measurables in the first set. Each weighted z-score may then be aggregated to generate a score for an object associated with the first set. The score for the object may be utilized to rank the object relative to other objects in the filtered sample of data.

20 Claims, 14 Drawing Sheets

(56) References Cited

U.S. PATENT DOCUMENTS

| | | |
|---|---|---|
| 8,447,420 B2 | 5/2013 | Bloodworth |
| 8,579,632 B2 | 11/2013 | Crowley |
| 8,602,946 B2 | 12/2013 | Chapa, Jr. et al. |
| 8,606,784 B2 | 12/2013 | Snyder |
| 8,721,342 B2 | 5/2014 | Prstojevich |
| 8,845,495 B2 | 9/2014 | Chapa, Jr. et al. |
| 8,944,959 B2 | 2/2015 | Chapa, Jr. et al. |
| 9,358,469 B1* | 6/2016 | Nicholas ............... A63F 13/828 |
| 2001/0034734 A1 | 10/2001 | Whitley et al. |
| 2008/0032271 A1 | 2/2008 | Johnson |
| 2008/0269644 A1 | 10/2008 | Ray |
| 2010/0129780 A1* | 5/2010 | Homsi ............... A63B 24/0062 434/258 |
| 2011/0004110 A1* | 1/2011 | Shusterman ........ G06F 19/3443 600/509 |
| 2011/0053121 A1* | 3/2011 | Heaton .............. A61B 5/14532 434/127 |
| 2011/0262915 A1* | 10/2011 | Hill ..................... C12Q 1/6888 435/6.11 |
| 2012/0130514 A1 | 5/2012 | Homsi et al. |
| 2012/0130515 A1 | 5/2012 | Homsi et al. |
| 2012/0179277 A1 | 7/2012 | Lymberopoulos |
| 2014/0039651 A1 | 2/2014 | Crowley |
| 2014/0155178 A1 | 6/2014 | Bloodworth |
| 2014/0379107 A1 | 12/2014 | Arjomand |
| 2015/0106052 A1* | 4/2015 | Balakrishnan ....... A61B 5/1123 702/150 |
| 2015/0148926 A1 | 5/2015 | Chap, Jr. et al. |
| 2015/0273312 A1 | 10/2015 | Mazzocchi |
| 2015/0294429 A1 | 10/2015 | Williams |

OTHER PUBLICATIONS

Dumond et al., "An Economic Model of the College Football Recruiting Process," Journal of Sports Economics 2008; 9; 67 originally published online May 16, 2007, document of 22 pages.

Athletic Standard, Inc., http://athleticstandard.com, accessed Dec. 2015, document of 2 pages.

Motion Guidance LLC, https://www.motionguidance.com, accessed Dec. 2015, document of 3 pages.

Kernen, "Ignite360: IMG Academy's New Test for Assessing Athletes," http://breakingmuscle.com/strength-conditioning/ignite360-img-academys-new-test-for-assessing-athletes, accessed Dec. 2015, document of 3 pages.

* cited by examiner

High School Portal

200

CHOOSE SPORT ▼

SSAT PERCENTILE SCORE
STATE:      NATIONAL :
___ %      ___ %

SOCIAL MEDIA
FACEBOOK: ___
TWITTER: ___
INSTAGRAM: ___
HUDL: ___
EMAIL: ___

HIGHLIGHT TAPE

Desired Schools/SSAT AVG.
1. _____  ___
2. _____  ___
3. _____  ___
4. _____  ___
5. _____  ___
6. _____  ___
7. _____  ___
8. _____  ___
9. _____  ___
10. _____  ___

Past Measurements ▼

PLAYER NAME   SPORT

GRADUATION

HIGH SCHOOL

POSITION

HEIGHT

WEIGHT

MEASUREMENTS
40: ___
5-10-5: ___
BROAD: ___
VERT: ___
BENCH: ___
DATE ACQUIRED: ___

ACADEMIC
GPA: ___
DESIRED MAJOR: ___
UNWEIGHTED:
SAT:
ACT:
CLASS RANK:

COLLEGE RECRUITING COACH PORTAL

| GRAD YR ▼ | Position ▼ |

FAVORITED ATHLETES

Jeff Jones    2014
Joe Smith    2014

ATHLETES INTERESTED IN PROGRAM/ SSAT SCORE

_Jeff Jones___    1.9
_Joe Smith___    2.2

COMPARE ATHLETES

CURRENT PLAYERS

FIG. 8

DATABASE 1100

| NAME ATHLETE # | SPORT | #1 | #2 | #3 |
|---|---|---|---|---|
| Joe Smith | Football | 40 yd = 4.4 | Vertical = 30 | Shuttle = 4.1 |
| Jeff Jones | Football | 40 yd = 4.5 | Vertical = 40 | Shuttle = 4.2 |
| Mike Anderson | Football | 40 yd = 4.3 | Vertical = 45 | Shuttle = 4.3 |
| John Williams | Track | 40 yd = 4.1 | Vertical = 50 | Shuttle = 4.4 |
| Adam Carter | Basketball | 40 yd = 4.4 | Vertical = 40 | Shuttle = 4.5 |
| Brad Johnson | Baseball | 40 yd = 4.8 | Vertical = 25 | Shuttle = 4.6 |
| Philip George | Basketball | 40 yd = 4.2 | Vertical = 35 | Shuttle = 4.2 |

FIG. 11

CUSTOMIZABLE DATA AGGREGATING, DATA SORTING, AND DATA TRANSFORMATION SYSTEM

This application claims priority to and the benefit of U.S. Provisional Patent Application No. 62/276,002, filed on Jan. 7, 2016, which is hereby incorporated by reference in its entirety.

FIELD OF THE INVENTION

The present application relates to data aggregation technologies, data sorting technologies, data transformation technologies, and computing technologies, and more particularly, to a customizable data aggregating, data sorting, and data transformation system.

BACKGROUND

In today's technologically-driven society, there exist various technical processes and systems for aggregating and sorting data to assist in the determination of the performance of one individual when compared to another, the performance of one device when compared to another, or the performance of anything when compared to another thing. Currently, for example, there exist large databases of athletic data, which include combine measurements for various exercises that athletes participate in during one or more combine events. Such data may include, but is not limited to, the athlete's name and demographic information, along with the athlete's specific raw measurements for each of the various exercises that a particular athlete has participated in. While recruiters of athletes can attempt to sift through such large databases of athletic data to determine the optimal candidates for their programs, such large databases are often unwieldy and difficult to navigate through with existing technologies. As a result, current recruiters often resort to ranking athletes based on word-of-mouth or by viewing substantial amounts of game film. While top athletic recruiters at top athletic programs do a decent job of finding higher tier athletes for their athletic programs, they still struggle in finding the optimal candidates that have the optimal skills for selected positions of a particular sports team. Additionally, lower tier athletic programs often struggle in finding quality candidates because of a lack of funding, a lack of time, and a lack of access to any sort of centralized and valid information databases.

While various types of data aggregation and sorting technologies and processes exist today, such technologies and processes still have many shortcomings. For example, even though athletic data is often available for various athletes, such data is often invalid or skewed due to the exaggerations made by high school coaches for the benefit of the athletes entering the recruiting process. Additionally, current technologies and processes do not readily allow recruiters to target specific traits and characteristics of athletes in an efficient manner. Furthermore, current technologies and processes often place complete control and analysis of the data with the proprietor of the system handling the data. Moreover, while current technologies have attempted to create indices of athletic measurables, such indices are created using standardized formulas which are fixed by a particular organization and do not allow for customization. As a result, current data aggregation, data sorting, and data transformation technologies and processes may be modified and improved so as to provide enhanced functionality and features for users and companies. Such enhancements and improvements to data aggregation, data sorting, and data transformation technologies and processes may provide for improved user satisfaction, increased efficiencies, increased access to meaningful data, substantially-improved decision-making abilities, and increased ease-of-use for users.

SUMMARY

A customizable data aggregating, data sorting, and data transformation system and accompanying methods are disclosed. In particular, the system and accompanying methods serve to enable an individual or a device to select the exact type and amount of various measurables and the relative importance of the selected measurables. Such measurables are then utilized to create an overall index rating for an individual, device, or object associated with the measurables. The ratings may then be utilized to select the optimal individual, device, or object for a desired purpose. In further detail, the systems and methods involve storing large amounts of data associated with verified measurables. Measurables may include, but are not limited to, anything that can be measured, such as but not limited to, an individual's performance in an exercise event, a device's performance relating to device-based tasks, the effect of a pharmaceutical drug's effect on the body, any other type of measurable, or any combination thereof. The system and methods allow a user or a device to customize an index for selected athletes or other things of interest, for example. This solves a technical problem existing in previously existing technologies and processes, because the system and methods provide users or devices with access to the formulas utilized by the system, which ultimately determine how the index is developed. As scores or values are entered into the formulas, the relative importance of each score or value is set by any organization, individual, or device creating the formula. Thus, the overall index score will change as higher and lower raw scores or values are entered into the formulas, however, the relative importance of each transformation may not.

As an exemplary scenario, the system and methods may allow a user (e.g. a recruiter of an athlete) or device to apply a set number of multipliers to a set of standardized z-scores corresponding to exercises (e.g. combine movements) performed by athletes at a combine event. These transformed z-scores may be added together to create an overall athletic index. The system and methods may allow a user or device to determine how many total athletes are in databases and how much adding a particular exercise to the search would reduce the total number of athletes in a search. The user or device may then select exercises of interest depending on what type of athlete is desired. The user or device may select one or more filters to be applied to the athlete data sample and then averages and standard deviations may be calculated for all the exercises depending on the applied filters. Once the various exercises are selected through the filtration process, the user or device may adjust a multiplier effect to each selected dataset's z-scores for the exercises. The system and methods may include creating an absolute number of multipliers in set increments and then allow the user or device to allocate such multipliers to the z-scores of each athlete's exercise. Once the weights (i.e. multipliers) are selected, the z-scores may be aggregated into a single athletic index. As a result, the system and methods provide the ability to select both the type and amount of exercises and the relative contribution of each exercise to the overall athletic index rating. The system and methods provide for a customized search feature that has not been provided by previously existing technologies. Other technologies lock in the type and contribution of exercises to an overall athletic index by attempting to normalize an array of datasets. The system and methods improve upon such technologies by enabling users and devices to add and remove exercises from their searches and adjust the relative contribution of each exercise to the overall athletic index rating. As a result, the system and methods provide substantial improvements because additional search customizations facilitated by the system and methods greatly reduce the number of database records that have to be traversed or accessed.

In the exemplary scenario described above, the system and methods allow for a more transparent recruiting process for both an athlete potentially being recruited and a recruiter or device doing the recruiting. The system and methods allow for previously simple data to be combined and used to create a detailed ranking system in which recruiters can use for their benefit. Additionally, the system and methods allow athletes to understand where they are ranked based on their particular sport, position on a team within the sport, their demographic information, or other information. Furthermore, the system and methods allow the recruiter to have control over what aspects they deem valuable and allow for a particular coach's style of play to be taken into account. Moreover, the system and methods transform and present athletic data in an easy-to-use and analyze format. As a result, the data aggregating, data sorting, and data transformation system and methods provide improvements and enhancements to previously existing technologies and processes, improved user satisfaction, improved relevance of data, reduced usage of computing resources, increased efficiencies, and increased ease-of-use.

In one embodiment, a customizable data aggregating, data sorting, and data transformation system is disclosed. The system may include a memory that stores instructions and a processor that executes the instructions to perform operations conducted by the system. The system may apply a first filter to a sample of data corresponding to a plurality of measurable actions performed by a plurality of objects to generate a first filtered sample of data corresponding to a first subset of the plurality of measurable actions. The objects may be any thing or persons of interest. For example, the objects may be people, computing devices, mechanical devices, or anything of interest. Additionally, the system may calculate a mean value for each of the plurality of measurable actions in the first filtered sample of data and a standard deviation value for each of the plurality of measurable actions in the first filtered sample of data. Also, the system may select a first set of raw measurements for a first set of measurable actions for a first object of the plurality of objects. The first set of measurable actions may correspond to the first subset of the plurality of measureable actions. The system may proceed to calculate a z-score for each of the measurable actions in the first set of measurable actions. The z-score may be calculated based on the mean value, the standard deviation value, and the first set of raw measurements. The system may receive one or more weights to be applied to each z-score. Based on the received weights to be applied to each z-score for each of the measurable actions in the first set of measurable actions, a weighted z-score for each of the measureable actions in the first set of measurable actions may be determined by the system. The system may then aggregate or add each weighted z-score for each of the measurable actions in the first set of measurable actions to generate a first score for the first object. Finally, the system may compare the first score for the first object to other scores for other objects in the plurality of objects to determine a ranking for the first object with respect to the other objects.

In another embodiment, a method for providing customizable data aggregating, data sorting, and data transformation is disclosed. The method may include utilizing a memory that stores instructions, and a processor that executes the instructions to perform the various functions of the method. In particular, the method may include applying one or more filters to a sample of data corresponding to a plurality of measurable actions performed by a plurality of objects to generate a first filtered sample of data corresponding to a first subset of the plurality of measurable actions. The objects may be any thing or persons of interest. For example, the objects may be people, computing devices, mechanical devices, or anything of interest. Once the one or more filters are applied, the method may include calculating a mean value for each of the plurality of measurable actions in the first filtered sample of data and a standard deviation value for each of the plurality of measurable actions in the first filtered sample of data. The method may then include selecting a first set of raw measurements for a first set of measurable actions for a first object of the plurality of objects. The first set of measurable actions may correspond to the first subset of the plurality of measureable actions. After the raw measurements are selected, the method may include calculating a z-score for each of the measurable actions in the first set of measurable actions, which may be based on the mean value, the standard deviation value, and the first set of raw measurements. The method may then include calculating, based on a weight to be applied to each z-score for each of the measurable actions in the first set of measurable actions, a weighted z-score for each of the measureable actions in the first set of measurable actions. The method may then include aggregating each weighted z-score for each of the measurable actions in the first set of measurable actions to generate a first score for the first object. Finally, the method may include comparing the first score for the first object to other scores for other objects in the plurality of objects to determine a ranking for the first object with respect to the other objects.

According to yet another embodiment, a computer-readable device having instructions for providing a customizable data aggregating, data sorting, and data transformation system is provided. The computer instructions, which when loaded and executed by a processor, may cause the processor to perform operations including: applying a first filter to a sample of data corresponding to a plurality of measurable actions performed by a plurality of objects to generate a first filtered sample of data corresponding to a first subset of the plurality of measurable actions; calculating a mean value for each of the plurality of measurable actions in the first filtered sample of data and a standard deviation value for each of the plurality of measurable actions in the first filtered sample of data; selecting a first set of raw measurements for a first set of measurable actions for a first object of the plurality of objects, wherein the first set of measurable actions correspond to the first subset of the plurality of measureable actions; calculating a z-score for each of the measurable actions in the first set of measurable actions, wherein the z-score is calculated based on the mean value, the standard deviation value, and the first set of raw measurements; calculating, based on a weight to be applied to each z-score for each of the measurable actions in the first set of measurable actions, a weighted z-score for each of the measureable actions in the first set of measurable actions; aggregating each weighted z-score for each of the measurable actions in the first set of measurable actions to generate a first score for the first object; and comparing the first score for the first object to other scores for other objects in the plurality of objects to determine a ranking for the first object with respect to the other objects.

These and other features of the systems and methods for providing a customizable data aggregating, data sorting, and data transformation system are described in the following detailed description, drawings, and appended claims.

BRIEF DESCRIPTION OF THE DRAWINGS

FIG. 6 is a diagram illustrating a sample graphical user interface of a sample portal to be utilized with the system of FIG. 1.

FIG. 8 is a diagram illustrating another sample graphical user interface to be utilized with the sample portal of FIG. 7.

FIG. 11 is a diagram is a sample database layout for use in the system of FIG. 1.

DETAILED DESCRIPTION OF THE INVENTION

Figure 1:
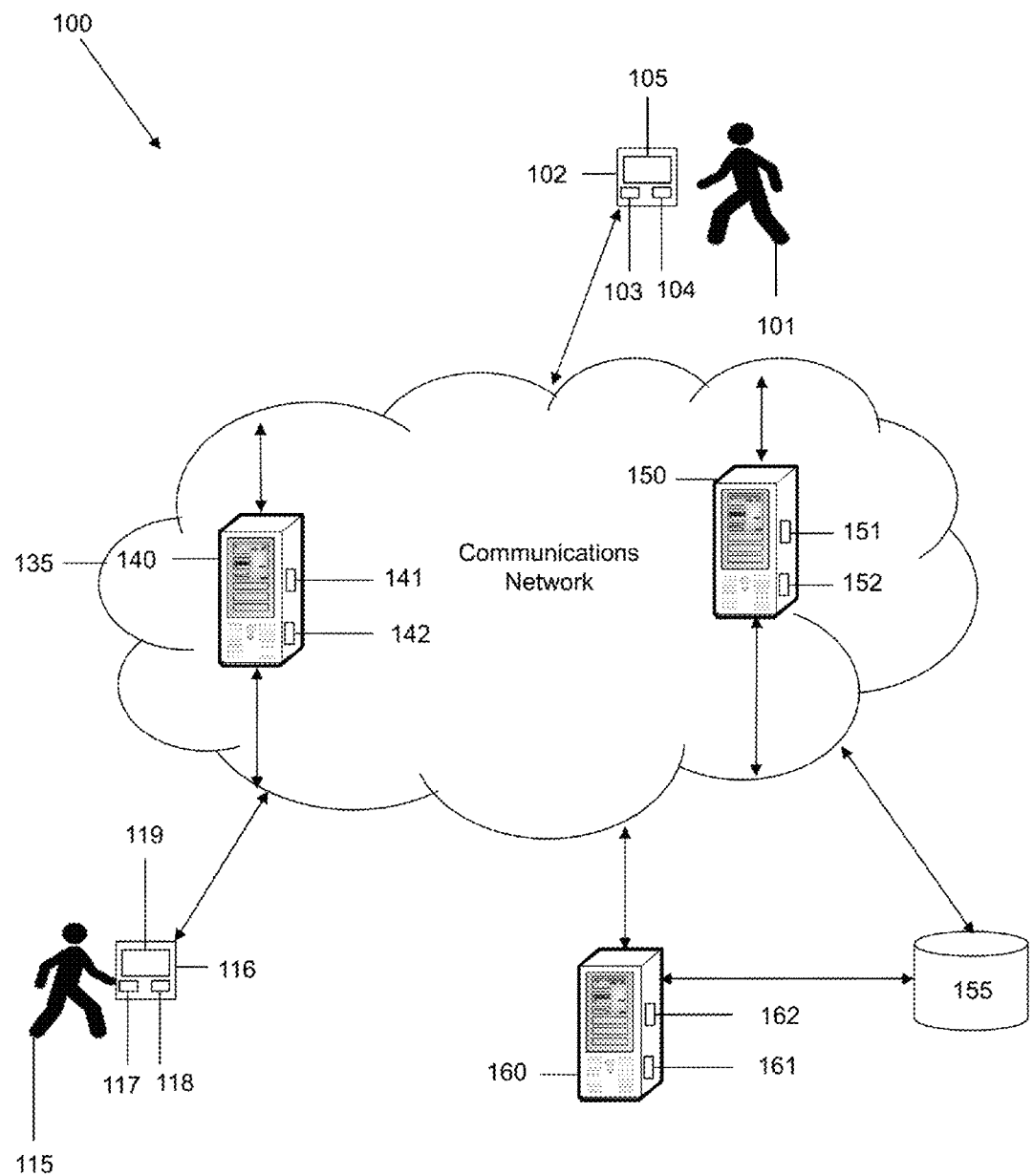
FIG. 1 is a schematic diagram of a customizable data aggregating, data sorting, and data transformation system according to an embodiment of the present disclosure.
Figure 2:
FIG. 2 is a diagram illustrating sample portals that may be utilized with the system of FIG. 1.

A customizable data aggregating, data sorting, and data transformation system 100 and accompanying methods are disclosed, as shown in FIGS. 1-14. In particular, the system 100 and accompanying methods serve to enable an individual or a device to select the exact type and amount of various measurables and the relative importance of the selected measurables. Such measurables are then utilized to create an overall index rating for an individual, device, or object associated with the measurables. The ratings may then be utilized to select the optimal individual, device, or object for a desired purpose, such as for recruiting purposes or for determining a top performer. To that end, the system 100 and methods involve storing large amounts of data associated with verified measurables. Measurables may include, but are not limited to, anything that can be measured, such as but not limited to, an individual's performance in an exercise event, a device's performance relating to device-based tasks, the effect of a pharmaceutical drug's effect on the body, any other type of measurable, or any combination thereof. The system 100 and methods allow a user or a device to customize an index for selected athletes or other things of interest, for example. This solves a technical problem existing in previously existing technologies and processes, because the system 100 and methods allow users or devices with access to the formulas, which ultimately determine how the index is developed. As scores or values are entered into the formulas, the relative importance of each score or value may be set by any organization, individual, or device creating the formula. Thus, the overall index score may change as higher and lower raw scores or values are entered into the formulas, however, the relative importance of each transformation may not.

As an exemplary scenario, the system 100 and methods may allow a user (e.g. a recruiter of an athlete) or device to apply a set number of multipliers to a set of standardized z-scores corresponding to exercises (e.g. combine movements) performed by athletes at a combine event. These transformed z-scores may be added together to create an overall athletic index. The system 100 and methods may allow a user or device to determine how many total athletes are in databases (e.g. database 155) and how much adding a particular exercise to the search would reduce the total number of athletes in a search. The user or device may then select exercises of interest depending on what type of athlete is desired. The user or device may select one or more filters to be applied to the athlete data sample and then averages and standard deviations may be calculated for all the exercises depending on the applied filters. Once the various exercises are selected through the filtration process, the user or device may adjust a multiplier effect to each selected dataset's z-scores for the exercises. The system 100 and methods may include creating an absolute number of multipliers in set increments and then allow the user or device to allocate such multipliers to the z-scores of each athlete's exercise. Once the weights (i.e. multipliers) are selected, the z-scores may be aggregated into a single athletic index. As a result, the system 100 and methods provide the ability to select both the type and amount of exercises and the relative contribution of each exercise to the overall athletic index rating. The system 100 and methods provide for a customized search feature that has not been provided by previously existing technologies. Other technologies lock in the type and contribution of exercises to an overall athletic index by attempting to normalize an array of datasets. The system 100 and methods improve upon such technologies by enabling users and devices to add and remove exercises from their searches and adjust the relative contribution of each exercise to the overall athletic index rating. As a result, the system 100 and methods provide substantial improvements because additional search customizations facilitated by the system 100 and methods greatly reduce the number of database records that have to be traversed or accessed.

The system 100 and methods allow for previously simple data to be combined and used to create a detailed ranking system in which users, such as recruiters, can use for their benefit. Additionally, the system 100 and methods allow athletes or other individuals to understand where they are ranked based on their particular sport, position on a team within the sport, their demographic information, or other information. Furthermore, the system 100 and methods allow the recruiter to have control over what aspects they deem valuable and allow for a particular coach's style of play to be taken into account. Moreover, the system 100 and methods transform and present athletic data in an easy-to-use and analyze format. As a result, the data aggregating, data sorting, and data transformation system 100 and methods provide improvements and enhancements to previously existing technologies and processes, provide for improved user satisfaction, provide for improved relevance of data, provide for reduced usage of computing resources, provide for increased efficiencies, and provide for increased ease-of-use.

As shown in FIGS. 1-14, a customizable data aggregating, data sorting, and data transformation system 100 (i.e. system 100) is disclosed. The system 100 may be configured to support, but is not limited to supporting, data and content services, computing applications and services, cloud computing services, internet services, satellite services, telephone services, software as a service (SaaS) applications, mobile applications and services, and any other computing applications and services. The system may include a first user 101, who may utilize a first user device 102 to access data, content, and applications, or to perform a variety of other tasks and functions. As an example, the first user 101 may utilize first user device 102 to access an application (e.g. a browser or a mobile application) executing on the first user device 102 that may be utilized to access web pages, data, and content associated with the system 100. In certain embodiments, the first user 101 may be a recruiter, an athlete, a physician, an engineer, or any type of user. The first user device 102 may include a memory 103 that includes instructions, and a processor 104 that executes the instructions from the memory 103 to perform the various operations that are performed by the first user device 102. In certain embodiments, the processor 104 may be hardware, software, or a combination thereof. The first user device 102 may also include an interface 105 (e.g. screen, monitor, graphical user interface, etc.) that may enable the first user 101 to interact with various applications executing on the first user device 102, to interact with various applications executing within the system 100, and to interact with the system 100. In certain embodiments, the first user device 102 may be a computer, a laptop, a tablet device, a phablet, a server, a mobile device, a smartphone, a smart watch, and/or any other type of computing device. Illustratively, the first user device 102 is shown as a computer in FIG. 1.

In addition to the first user 101, the system 100 may include a second user 115, who may utilize a second user device 116 to access data, content, and applications, or to perform a variety of other tasks and functions. Much like the first user 101, the second user 115 may utilize second user device 116 to access an application (e.g. a browser or a mobile application) executing on the first user device 102 that may be utilized to access web pages, data, and content associated with the system 100. The second user device 116 may include a memory 117 that includes instructions, and a processor 118 that executes the instructions from the memory 117 to perform the various operations that are performed by the second user device 116. In certain embodiments, the processor 118 may be hardware, software, or a combination thereof. The second user device 116 may also include an interface 119 (e.g. a screen, a monitor, a graphical user interface, etc.) that may enable the second user 115 to interact with various applications executing on the second user device 116, to interact with various applications executing in the system 100, and to interact with the system 100. In certain embodiments, the second user device 116 may be a computer, a laptop, a tablet device, a phablet, a server, a mobile device, a smartphone, a smart watch, and/or any other type of computing device. Illustratively, the second user device 116 is shown as a mobile device in FIG. 1.

In certain embodiments, the first user device 102 and the second user device 116 may have any number of software applications and/or application services stored and/or accessible thereon. For example, the first and second user devices 102, 116 may include cloud-based applications, database applications, algorithmic applications, phone-based applications, product-ordering applications, business applications, e-commerce applications, media streaming applications, content-based applications, media-editing applications, database applications, gaming applications, internet-based applications, browser applications, mobile applications, service-based applications, productivity applications, video applications, music applications, social media applications, any other type of applications, any types of application services, or a combination thereof. In certain embodiments, the software applications and services may include one or more graphical user interfaces (e.g. as shown in FIGS. 2 and 6-11) so as to enable the first and second users 101, 115 to readily interact with the software applications. Sample user interfaces for use with the system 100 are illustratively shown in FIGS. 2 and 6-11. The software applications and services may also be utilized by the first and second users 101, 115 to interact with any device in the system 100, any network in the system 100, or any combination thereof. For example, the software applications executing on the first and second user devices 102, 116 may be applications for aggregating data, applications for storing data, applications for transforming data, applications for executing mathematical algorithms, any other type of application, or a combination thereof. In certain embodiments, the first and second user devices 102, 116 may include associated telephone numbers, internet protocol addresses, device identities, or any other identifiers to uniquely identify the first and second user devices 102, 116.

The system 100 may also include a communications network 135. The communications network 135 of the system 100 may be configured to link each of the devices in the system 100 to one another. For example, the communications network 135 may be utilized by the first user device 102 to connect with other devices within or outside communications network 135. Additionally, the communications network 135 may be configured to transmit, generate, and receive any information and data traversing the system 100. In certain embodiments, the communications network 135 may include any number of servers, databases, or other componentry, and may be controlled by a service provider. The communications network 135 may also include and be connected to a cloud-computing network, a phone network, a wireless network, an Ethernet network, a satellite network, a broadband network, a cellular network, a private network, a cable network, the Internet, an internet protocol network, a content distribution network, any network, or any combination thereof. Illustratively, servers 140 and 150 are shown as being included within communications network 135.

Notably, the functionality of the system 100 may be supported and executed by using any combination of the servers 140, 150, and 160. The servers 140, and 150 may reside in communications network 135, however, in certain embodiments, the servers 140, 150 may reside outside communications network 135. The servers 140, and 150 may be utilized to perform the various operations and functions provided by the system 100, such as those requested by applications executing on the first and second user devices 102, 116. In certain embodiments, the server 140 may include a memory 141 that includes instructions, and a processor 142 that executes the instructions from the memory 141 to perform various operations that are performed by the server 140. The processor 142 may be hardware, software, or a combination thereof. Similarly, the server 150 may include a memory 151 that includes instructions, and a processor 152 that executes the instructions from the memory 151 to perform the various operations that are performed by the server 150. In certain embodiments, the servers 140, 150, and 160 may be network servers, routers, gateways, switches, media distribution hubs, signal transfer points, service control points, service switching points, firewalls, routers, edge devices, nodes, computers, mobile devices, or any other suitable computing device, or any combination thereof. In certain embodiments, the servers 140, 150 may be communicatively linked to the communications network 135, any network, any device in the system 100, or any combination thereof.

The database 155 of the system 100 may be utilized to store and relay information that traverses the system 100, cache information and/or content that traverses the system 100, store data about each of the devices in the system 100, and perform any other typical functions of a database. In certain embodiments, the database 155 may be connected to or reside within the communications network 135, any other network, or a combination thereof. In certain embodiments, the database 155 may serve as a central repository for any information associated with any of the devices and information associated with the system 100. Furthermore, the database 155 may include a processor and memory or be connected to a processor and memory to perform the various operation associated with the database 155. In certain embodiments, the database 155 may be connected to the servers 140, 150, 160, the first user device 102, the second user device 116, any devices in the system 100, any other device, any network, or any combination thereof.

The database 155 may also store information obtained from the system 100, store information associated with the first and second users 101, 115, store user profiles associated with the first and second users 101, 115, store device profiles associated with any device in the system 100, store communications traversing the system 100, store user preferences, store information associated with any device or signal in the system 100, store information relating to usage of applications accessed by the first and second user devices 102, 116, store any information obtained from any of the networks in the system 100, store historical data associated with the first and second users 101, 115, store device characteristics, store information relating to any devices associated with the first and second users 101, 115, or any combination thereof. In certain embodiments, the database 155 may also be configured to store any type of raw data associated with one or more measurables (e.g. raw athletic data corresponding to exercises performed by athletes) received by the system 100, filters selected by the first and second users 101, 115 or the devices 102, 116, mean values and standard deviation values for measurables determined by the system 100, z-scores determined for the measurables, weights to be applied to the z-scores, weighted z-scores calculated based on the weights, aggregated values of the weighted-z scores that are utilize to generate a score for an individual, item, or object of interest that is associated with the measurables, rankings for the individual, item or object of interest, any input or output of the system 100, or any combination thereof. FIG. 11 illustrates a sample database layout for a record for use in the system 100. In certain embodiments, the database 155 may be configured to store any information generated and/or processed by the system 100, store any of the information disclosed for any of the operations and functions disclosed for the system 100 herewith, store any information traversing the system 100, or any combination thereof. Furthermore, the database 155 may be configured to process queries sent to it by any device in the system 100.

The system 100 may also include one or more software-based portals, which may be configured to perform and support the operative functions of the system 100. The portals may be tailored to any type of industry, any type of measurable data, any type of topic of interest, or any combination thereof. In an exemplary scenario, as shown in FIGS. 2-11, the portals may be tailored to an athletic recruiting process and may include, but are not limited to including, a high school athlete portal 200, a college recruiting coach portal 202, a combine staff and trainer portal 204, a college athlete portal 206, and a strength and conditioning portal 208. Each of the portals 202-208 may be accessible by accessing a browser program executing on the first or second user devices 102, 116, a mobile application executing on the first or second user devices 102, 116, or through other suitable means. Additionally, each of the portals 202-208 may allow users to register with the portals 202-208 and sign-in with authenticating username and password log-in combinations.

Figure 3:
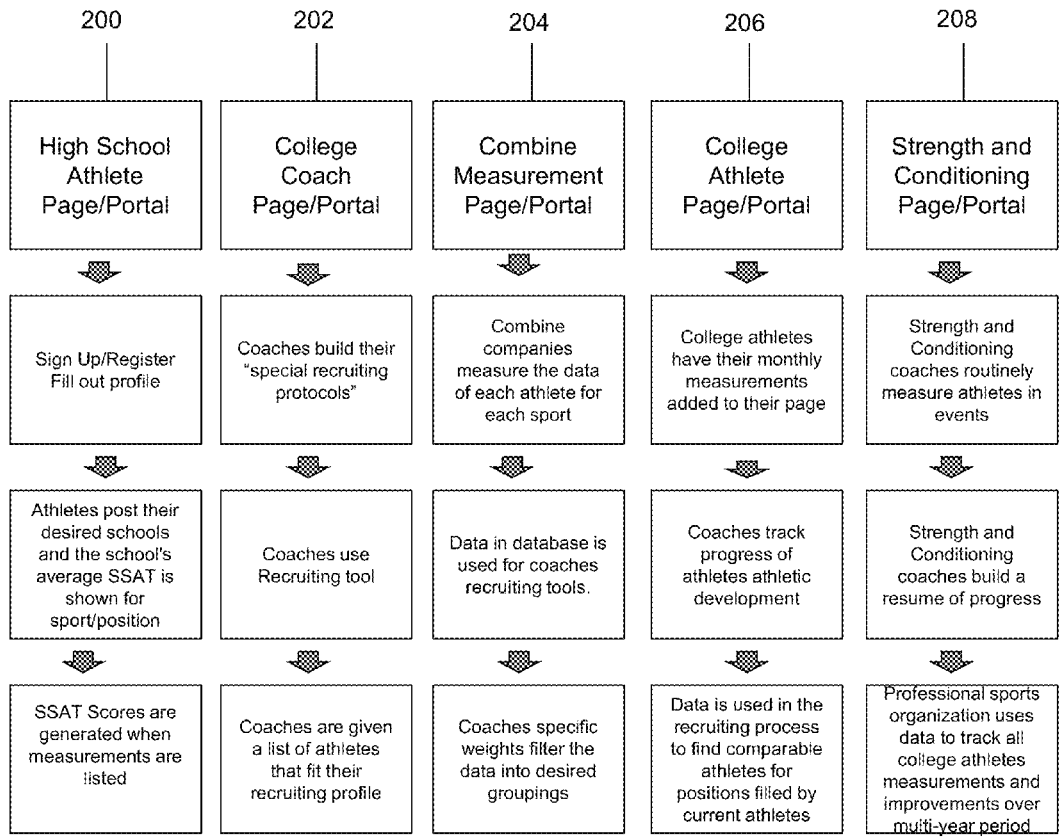
FIG. 3 is a diagram illustrating additional information relating to sample pages of sample portals that may be utilized with the system of FIG. 1.
Figure 4:
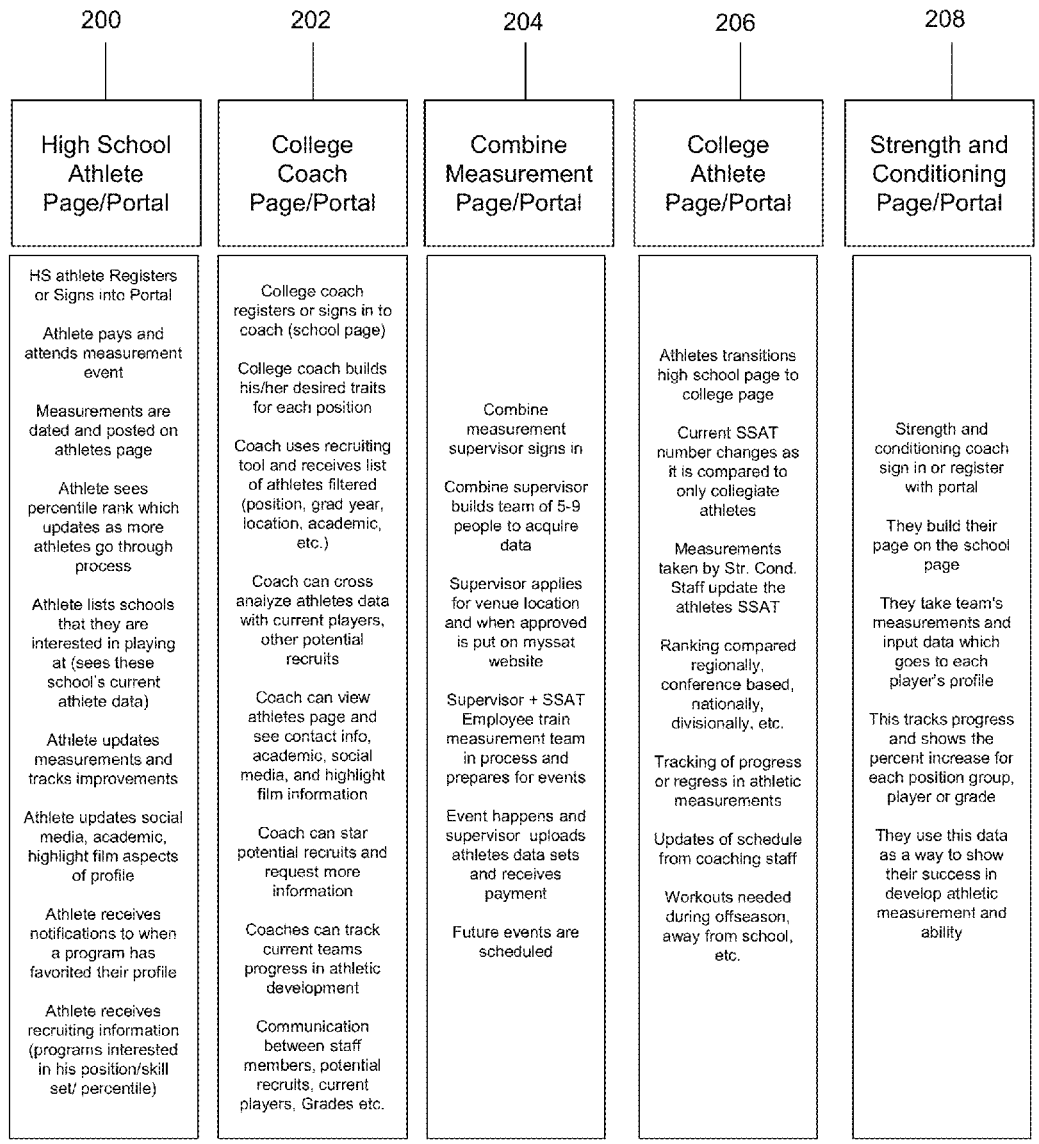
FIG. 4 is a diagram that provides further details relating to the sample pages of the sample portals of FIG. 3.
Figure 5:
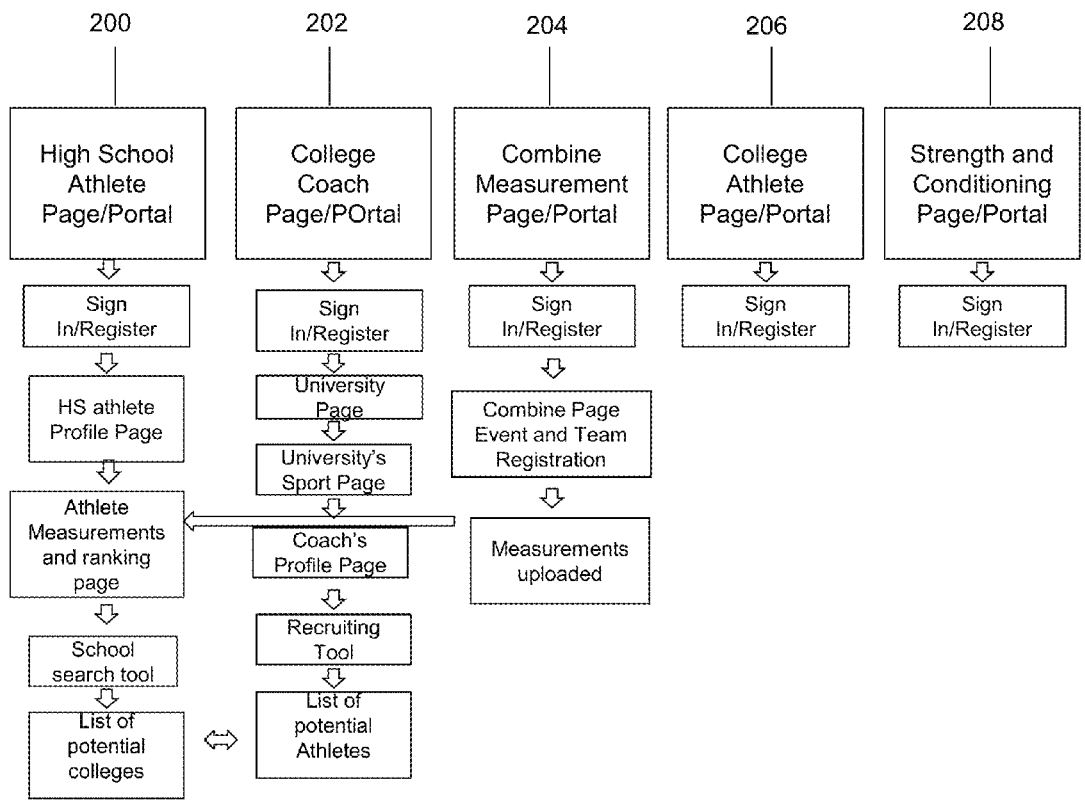
FIG. 5 is a diagram that provides still further details relating to the sample pages of the sample portals of FIG. 3.
Figure 7:
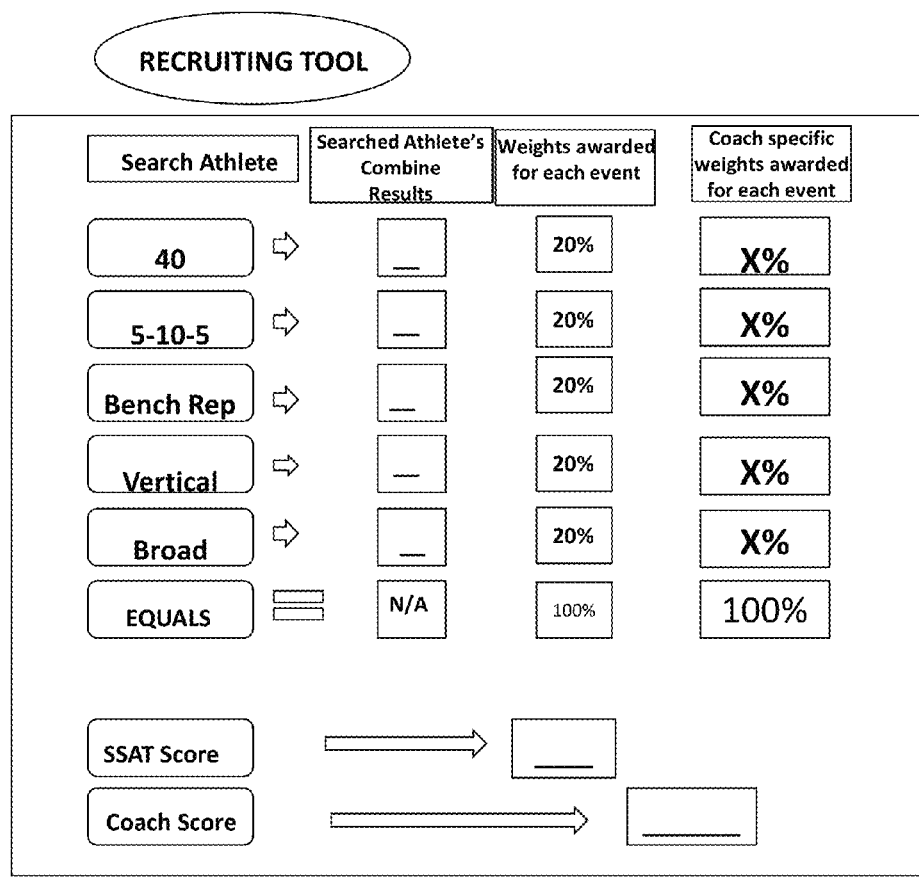
FIG. 7 is a diagram illustrating a sample graphical user interface of another sample portal to be utilized with the system of FIG. 1.

In an embodiment, the high school athlete portal 200, as shown in FIGS. 3-5, may include a registration page and a log-in section to allow one or more high school athletes to interact with the high school athlete portal 200. The high school athlete portal 200, as shown in FIG. 6, may allow an athlete to input their personal information, which may include, but is not limited to including, their name, age, height, weight, academic credentials, graduation year, sports position, high school, location, measurements for various measurables such as exercises and performance, video content associated with the athlete, audio content associated with the athlete, social media information corresponding to the athlete, contact information, or any other information into a user profile for the athlete. Additionally, the high school athlete portal 202 may allow the athletes to input their desired college programs that they would like to play for. Furthermore, the high school athlete portal 200 may calculate and display each college program's Sports Standardized Athletic Testing (SSAT) score for each college program. The SSAT score will be described in further detail later on in this disclosure. In an embodiments, the SSAT scores for the athletes may be generated when their own raw measurement data for various measurables associated with them are input into the system 100. For example, if the measurables correspond to a 40 yard dash time, a 3-Cone drill time, a shuttle time, a vertical leap measurement, a broad jump measurement, a bench press repetition count, SSAT scores may be calculated for the athlete based on the measurements corresponding to such measurables. In certain embodiments, the athlete's SSAT score at the state level and the national level may be calculated as well. The state level SSAT score may be based on data strictly associated with athletes in the same state as the athlete, and the national SSAT score may be based on data associated with the entire nation.

The high school athlete portal 200 may enable the athlete to pay and attend events so that their measurables (e.g. exercises) may be measured. Once the measurements are measured, the measurements may be input into the high school athlete portal 200, along with the athlete's percentile rank as compared with other athletes, which may be updated as more and more measurements are taken in real-time. The high school athlete portal 200 may also allow the athlete to see the typical measurements for athletes in the college programs that they are interested in. The high school athlete portal 200 may also update measurements in real-time as they are measured and track and report improvements in such measurements over time. In certain embodiments, the athlete may utilize the high school athlete portal 200 to update social media pages of the athlete with any of the information provided by the high school athlete portal 200, receive notifications from college programs when the college programs have listed his or her profile as a favorite athlete profile, and receive recruiting information from programs interested in the athlete's position, skill set, or percentile rank. The high school athlete portal 200 may include various web pages or content to host the various data and information associated with the high school athlete portal 200. For example, the high school athlete portal 200 may have a sign-in/register web page, a high school athlete profile page corresponding to the athlete's profile, an athlete measurements and ranking page, a school program search tool for searching programs of interest, and a list of potential colleges that the athlete may be interested in. Of course any other desired pages may be utilized as well.

The college recruiting coach portal 202, as shown in FIGS. 2-5 and 7-9, may also include a sign-in and registration page, which may allow a coach or recruiter to make their own profile in the college recruiting coach portal 202. While in the college recruiting coach portal 202, a recruiter or coach may set up their specific recruiting protocols as they relate to athletes for their specific college programs. The protocols may include specific parameters relating to the athlete's such as, but not limited to, a minimum desired ranking of the athlete, desired positions for a sports team, desired measurements for measurables (e.g. exercises), desired graduation year for the athlete, desired traits for the athlete, desired academic credentials for the athlete, desired location for the athlete, any other desired parameter, or any combination thereof. The college recruiting coach portal 202 may also include a recruiting tool, which may provide a list of athletes that have been filtered from the database 155 that includes all athletes' data based on the parameters specified by the recruiter or coach. The college recruiting coach portal 202 may also include functionality that allows the coach or recruiter to cross-analyze a given athlete's data with current players on their current team's roster or other potential recruits. Additionally, the college recruiting coach portal 202 may enable the recruiter or coach to view a desired high school athlete's page, such as the high school athlete page hosted by the high school athlete portal 200.

The college recruiting coach portal 202 may also enable the recruiter or coach to star, flag, or "favorite" their favorite athletes, and may request additional information for such athletes via the college recruiting coach portal 202, as shown in FIG. 8. Additionally, the college recruiting coach portal 202 may list current players that a coach is interested in, favorite athletes, athletes interested in the coach's sports program, and a comparison of athletes of interest, as shown in FIG. 8. In certain embodiments, the college recruiting coach portal 202 can enable the tracking of an athlete's progress and athletic development over time. In certain embodiments, the college recruiting coach portal 202 may include a messaging application that may enable the recruiter or coach to directly speak with potential recruits, training staff, or other individuals. The college recruiting coach portal 202 may include various web pages or content to host the various data and information associated with the college recruiting coach portal 202. For example, the college recruiting coach portal 202 may have a sign-in/register web page, a university/college page, a university/college page for each sport, a coach's/recruiter's profile page, a recruiting tool page, and a page including a list of potential athletes of interest. Of course any other desired pages may be utilized as well.

Figure 9:
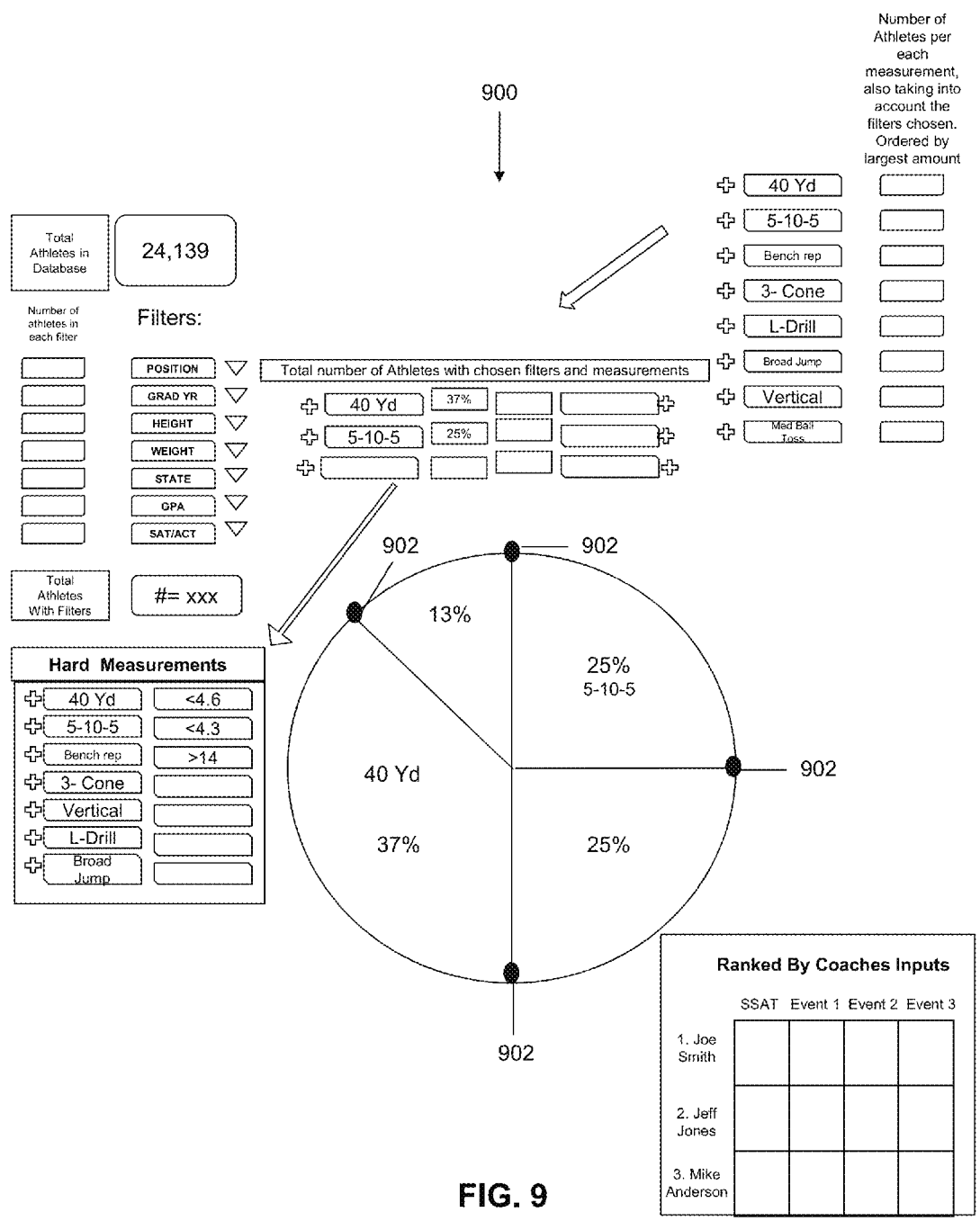
FIG. 9 is a diagram illustrating a sample graphical user interface for a recruiting tool to be utilized with the system of FIG. 1.

The recruiting tool, as shown in the graphical user interface 900 shown in FIG. 9, may be utilized by a recruiter or coach to determine the optimal candidates for their sports program and isolate them from a data set. For example, the recruiting tool may indicate a total number of athletes in the database 155 and may allow the recruiter or coach to apply one or more filters to the data sample. A filter may be any type of condition that may be set on a sample of data to ensure that any data resulting or selected after application of the filter to the sample of data satisfies the condition. For example, the filters may be filters relating to an athlete's position, graduation year, height, weight, location (e.g. state), academic credentials, other filters, or any combination thereof. As the recruiter or coach sets a filter, the number of athletes meeting the requirements of the filter may be presented on the graphical user interface 900 of the recruiting tool. As additional filters are set, the number of athletes meeting the original filter and the additional filters may be presented. As more filters are applied, the relevant data sample will be reduced accordingly. The recruiting tool may also allow the recruiter or coach choose which measurables they care about—this may serve as a second layer of filters for the system 100 to apply to the data sample. For example, in FIG. 9, sample measurables include the 40 yard dash, the 5-10-5 drill, the bench press test, the 3-Cone drill, an L-drill, a broad jump, a vertical, and a medicine ball toss. For each measurable selected, the number of athletes for each measurable may be displayed on the graphical user interface 900. In certain embodiments, the number of athletes for each measurable may be presented by largest amount first.

The recruiting tool may also allow recruiters or coaches to add different measurables and assign different percentage weights to each of the different measurables. These weights may be utilized in determining the SSAT score for an athlete, which will be described in further detail below. The weights may be utilized to add significance to certain measurables when compared with other measurables. For example, in FIG. 9, a 37% weight is attributed to the 40 yard dash measurable and a 25% weight is attributed to the 5-10-5 drill. In certain embodiments, the measurables and their corresponding weights may be displayed in a pie chart, as shown in FIG. 9. In certain embodiments, the circles 902 may be clicked on with an input device or contacted via a touchscreen of the first and second user devices 102, 116 to adjust the percentages for each measurable so that the pie chart may be updated in real-time. In certain embodiments, the recruiting tool may also give the ability to manipulate the data based on hard measurements, rather than by using the algorithms described herein or percentiles, as shown on the bottom left of FIG. 9. For example, if a coach wants to reduce the data sample by selecting only those athletes with 40 yard times below 4.6 seconds, the recruiting tool may be configured to enable such action. In certain embodiments, the recruiting tool may also allow for athlete's to be ranked, as shown in the bottom right of FIG. 9, based on their measurements and/or their SSAT score. The coach may pan an input device cursor over each athlete's name and see the hard measurements and user profile data for each athlete and desired athletes may be added to the coach's ranked list of athletes. In certain embodiments, the athletes may be ordered based on the chosen filters and measurables selected by the coach and/or the system 100.

Figure 10:
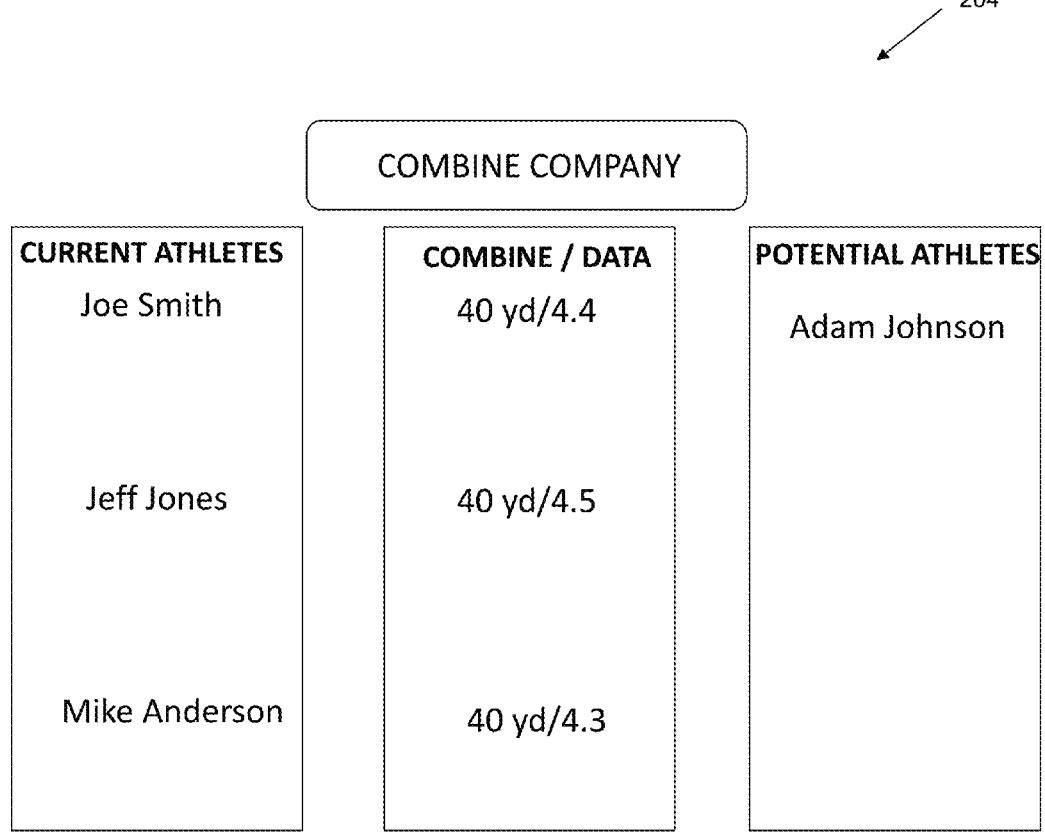
FIG. 10 is a diagram illustrating a sample graphical user interface for yet another sample portal to be utilized with the system of FIG. 1.
Figure 12:
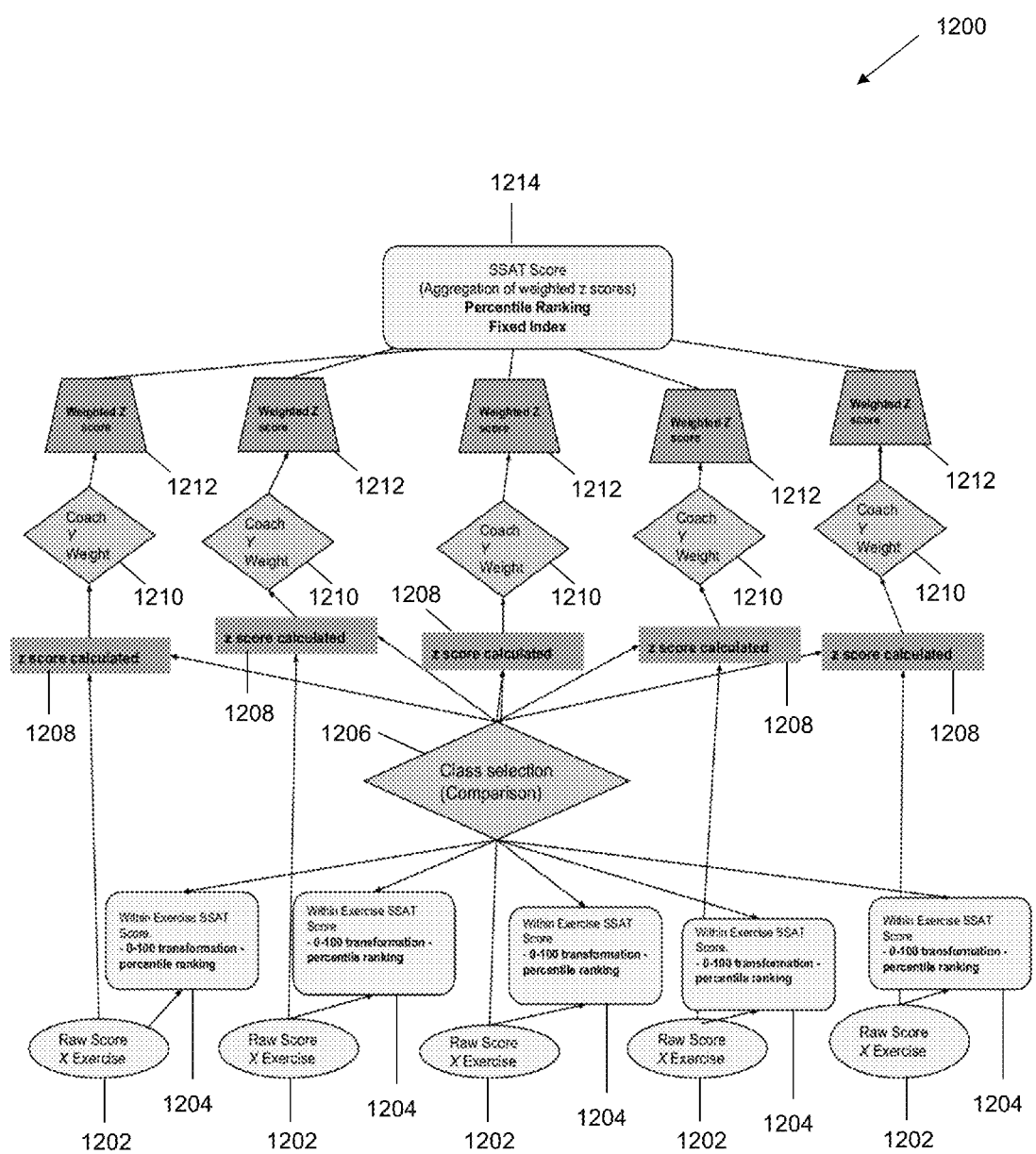
FIG. 12 is a system process flow for calculating and aggregating z-scores in the system of FIG. 1.

The combine staff and trainer portal 204, as shown in FIGS. 2-5 and 10, may also include a sign-in and registration page, which may enable a combine representative to set up their own profile in the system 100. The combine representative may build a team of individuals to acquire measurement data corresponding to various measurables at a combine event. The combine portal 204 may allow combine companies to upload, into the system 100, measurements for the various measurables, such as combine events, that the combine companies have measured. The measurements may be fed into each of the portals 202-208 and analyzed by the system 100. In certain embodiments, the measurements may be filtered based on the filters described in this disclosure. In certain embodiments, the combine staff and trainer portal 204 may also allow a combine representative to schedule future combine events, which may generate additional data to be input into the system 100 for processing. The combine staff and trainer portal 204 may include various web pages or content to host the various data and information associated with the combine staff and trainer portal 204. For example, the combine staff and trainer portal 204 may have a sign-in/register web page, a combine event and team registration page, and a page for uploading measurements obtained at a combine event. Of course any other desired pages may be utilized as well. In FIG. 10, an example graphical user interface for the combine staff and trainer portal 204 is shown. The graphical user interface may include a listing of athletes, the athlete's measurements, and a listing of potential athletes of interest. The interface may include any additional desired data as well.

The college athlete portal 206, as shown in FIGS. 3-5, may also include a sign-in and registration page, which may enable a college athlete to set up their own profile in the system 100. The college athlete portal 206 may allow the college athlete to upload their own demographic data and the measurement data for various measurables to their specific college athlete page in the college athlete portal 206. In certain embodiments, the coaches and recruiters may be granted access to the college athlete portal 206 so as to track the progress of the athletes at their programs. The data for the college athletes may be utilized by the coaches and the system 100 to determine comparable athletes (e.g. high school athletes) from the database 155 that may be utilized to replace the college athletes at some point in time. In certain embodiments, once a high school athlete becomes a college athlete, their profile and web page in the system 100 may be automatically updated to a college profile and web page. The athlete's SSAT score may be updated automatically by the system 100 to reflect the athlete's score relative to other college athletes rather than high school or other athletes. The college athlete's measurements may be utilized by strength and conditioning staff to update the athlete's SSAT score as well. In certain embodiments, the college athlete portal 206 may be utilized to rank the athlete regionally, by conference, nationally, divisionally, or through other desired ways. The athlete's progress at the college level may be tracked in real-time as new measurements are added to the system 100. In certain embodiments, updates relating to the athlete's schedule may be pushed to the college athlete portal 206 as well. In certain embodiments, scheduled workouts and other information may also be pushed to the college athlete portal 206.

The strength and conditioning portal 208, as shown in FIGS. 3-5, may also include a sign-in and registration page, which may enable a strength and conditioning staff member to set up their own profile in the system 100. The strength and conditioning portal 208 may upload and/or monitor progress data associated with an athlete's progress as it relates to the various measurables. Additionally, various professional sports organizations may be utilized to track all the athlete's measurements and improvements over a desired period of time. Of course any other necessary desired information may be accessed via the strength and conditioning portal 208. In FIG. 11, a sample database record layout 1100 for use with the system 100. The layout 1100 may include any of the information that the system 100 receives, outputs, and/or analyzes. For example, in layout 1100 the record includes the name of the athlete, the sport the athlete participates in, and a series of measurements relating to various measurables. The layout 1100 may also include z-scores for the measurables, weighted z-scores, SSAT scores, or any other information utilized by the system 100.

Operatively, the customizable data aggregating, data sorting, and data transformation system 100 may operate as shown in the following exemplary scenario. In the example scenario and referring now also to FIG. 12, the first user 101 may be an athlete and the second user 115 may be a recruiter. The first and second users 101, 115 may utilize the first and second user devices 102, 116 respectively to access the system 100 and one or more portals supported by the system 100. At 1202, raw scores for the first user 101 and other athletes may be uploaded into the system 100. A mean and a standard deviation for the raw scores may be calculated. The raw scores in this case may correspond to measurables relating to football. For example, the measurables may correspond with a bench press exercise, a vertical jump exercise, a broad jump exercise, a 40 yard dash, a 5-10-5 drill, or other measurables. At 1202, one or more filters may be applied to the raw scores, however, it is not necessary at this stage. In certain embodiments, the filters may be input by the second user 115 or by any device of the system 100. The filter, for example, may indicate that the only raw scores of interest should be the bench press raw score, vertical jump raw score, and the broad jump raw score. In certain embodiments and at 1204, the raw scores may be transformed into a 0-100 scale and/or to a percentile ranking For example, the transformation may be done by using the formula: New Score=100*(Old Score−Minimum Score)/(Minimum Score−Maximum Score).

At 1206, the second user 115 may select one or more filters to apply to the scores or any additional filters if other filters have been previously applied. For example, the second user 115 may specify by utilizing second user device 116 that the raw scores should be limited to athletes of specific graduation years or specify any other number of filters. At 1208, z-scores may be calculated for each of the measurables of interest. The z-scores may be calculated using the following formula: z-score=$(x-\mu)/\sigma$, where x is the raw measurement value, $\mu$ is the mean value, and $\sigma$ is the standard deviation value. At 1210, the system 100 may he configured to receive one or more weights from the second user 115 for each of the measurables of interest via the second user device 116. The weights may be percentages that add up to one hundred percent. For example, if the measurables of interest are the bench press, the vertical jump, and the broad jump, the weights may be 30%, 50%, and 20% respectively. At 1212, the system 100 may calculate weighted z-scores based on the weights. The weighted z-scores may be calculated by multiplying the corresponding weights with the corresponding z-scores from 1208. At 1214, the system 100 may aggregate the weighted z-scores to generate a score for each of the athletes having measurables corresponding to the filters, including the first, user 101. The score may be a SSAT score and may be converted into a percentile ranking, which may be utilized to indicate the first user's 101 rank relative to other athletes the first user 101 is being compared to.

In another example scenario, user filters may be applied to a sample of data. Each given sample from the filtration process, Sample A in this example, has a mean and a standard deviation for each exercise that an athlete may perform. Each athlete raw score set goes through a z-score equation based on weights supplied to the system 100 and is sorted from highest to lowest rank. In the following two examples, two different sets of weights will be utilized to illustrate how the system 100 operates. In the first example, filters may be applied and the measurables of interest may be the bench press, the vertical jump, and the broad jump. The mean and standard deviation may be calculated. In this example, the mean for Sample A may be 8 repetitions for the bench press, 30 inches for the vertical jump, and 8 inches for the broad jump. The standard deviation for Sample A for bench press may be 0.5 repetitions, the standard deviation for vertical jump may be 4 inches, and the standard deviation for the broad jump may be 1.0 inch. For a selected athlete of interest, such as the first user 101, the athlete's raw scores for these measurables may be 10 repetitions for the bench press, 34 inches for the vertical jump and 6 inches for the broad jump. The system 100 may proceed to calculate the z-score for each of these measurables. The z-score for the bench press may be $((10-8)/0.5)=4.0$, the z-score for the vertical jump may be $((34-30)/4)=1.0$, and the z-score for the broad jump may be $((6-8/1)=-2.0$. The system 100 may then receive weights to be applied to each of the z-scores. For example, the second user 115 may indicate that the bench press should have 60% weight, the vertical jump a 10% weight, and the broad jump a 30% weight. The system 100 may then proceed to calculate weighted z-scores based on the weights received into the system 100. The weighted z-score for the bench press may be $4*0.60=2.4$, the weighted z-score for the vertical jump may be $1*0.10=0.1$, and the weighted z-score for the broad jump may be $-2.0*0.30=-0.6$. Then, the first athlete's score (i.e. SSAT score) may be calculated by aggregating the weighted z-scores, which would be $2.4+0.10+0.6=1.9$.

The system 100 may also have a second athlete's raw scores. The second athlete's raw scores may be 15 repetitions for the bench press, 20 inches for the vertical jump, and 3 inches for the broad jump. The mean and the standard deviation values may be the same as indicated above. Based on the foregoing, the second athlete's z-score for the bench press is $((15-8)/0.5)=14.0$, the second athlete's z-score for the vertical jump is $((20-30)/4)=-2.5$, and the third athlete's z-score for the broad jump is $((3-8/1)=-5.0$. Using the same weights as above, the weighted z-scores for the second athlete will be $14*0.6=8.4$ for the bench press, $-2.5*0.10=0.25$ for the vertical jump, and $-5.0*0.3=-1.5$ for the broad jump. Then, the second athlete's score may be calculated by adding the weighted z-scores, which would be $8.4+0.25+-1.50=7.15$. Additionally, the system 100 may also have a third athlete's raw scores. The third athlete's raw scores may be 3 repetitions for the bench press, 44 inches for the vertical jump, and 12.0 inches for the broad jump. The third athlete's z-scores will be $((3-8/0.5)=-10.0$ for the bench press, $((44-30)/4)=3.5$ for the vertical jump, and $((12-8)/1)=4.0$ for the broad jump. The third athlete's weighted z-scores will be $-1.0*0.60=-6.0$ for the bench press, $3.5*0.1=0.35$ for the vertical jump, and $4*0.3=1.2$ for the broad jump. The third athlete's score may be calculated by adding the weighted z-scores, which would be $-6.0+0.35+1.20=-4.45$. Based on the foregoing, the rankings for the three athlete's would be as follows: $1^{st}$ The second athlete because his score is 7.15 based on the weights utilized in this example, $2^{nd}$ The first athlete because his score is 1.9 based on the weights utilized in this example, and $3^{rd}$ The third athlete because his score is -4.5 based on the weights utilized in this example.

In a second example, all of the data may be the same in the first example, except that the weights provided by the second user 115 may be different. In this example, the weight for the bench press may be 15%, the weight for the vertical jump may be 55%, and the weight for the broad jump may be 35%. Using these figures, the weighted z-scores for the first athlete will be $4*0.15=0.6$ for the bench press, $1*0.55=0.55$ for the vertical jump, and $-2.0*0.30=-0.6$ for the broad jump. The first athlete's score will be $0.6+0.55+-0.6=0.55$. The weighted z-scores for the second athlete will be $14*0.15=2.1$ for the bench press, $-2.5*0.55=-1.375$ for the vertical jump, and $-5.0*0.30=-1.5$ for the broad jump. The second athlete's score will be $2.1+-1.375+-1.5=-0.775$. The weighted z-scores for the third athlete will be $-10*0.15=-1.5$ for the bench press, $3.5*0.55=1.925$ for the vertical jump, and $4*0.3=1.2$ for the broad jump. The third athlete's score will be $-1.5+1.925+1.2=1.626$. This time around, the system 100 will rank the third athlete first, the first athlete second, and the second athlete third based on the weightings. As a result, the system 100 allows different weightings to provide dramatically different rankings of athletes based on the importance given to each of the measurables.

Notably, as shown in FIG. 1, the system 100 may perform any of the operative functions disclosed herein by utilizing the processing capabilities of server 160, the storage capacity of the database 155, or any other component of the system 100 to perform the operative functions disclosed herein. The server 160 may include one or more processors 162 that may be configured to process any of the various functions of the system 100. The processors 162 may be software, hardware, or a combination of hardware and software. Additionally, the server 160 may also include a memory 161, which stores instructions that the processors 162 may execute to perform various operations of the system 100. For example, the server 160 may assist in processing loads handled by the various devices in the system 100, such as, but not limited to, receiving raw measurements relating to one or more measurables associated with an object, individual, or item of interest; applying one or more filters to a sample of data including the raw measurements; calculating mean values and standard deviation values for the measurables based on the measurements; selecting a first set of raw measurements for a first set of measurables for a first object, person, or item of interest; calculating z-scores for each of the measurables; receiving weights to be applied to the z-scores; determining a weighted z-score for each of the measurables in the first set of measurables for the first object, person, or item of interest based on the weights; aggregating/adding each weighted z-score for each of the measurables in the first set to generate a score for the first object, person, or item of interest; comparing the score with other scores for other objects, persons, or items of interest to determine a ranking for the first object, person, or item of interest; adjusting any of the filters; and performing any other suitable operations conducted in the system 100 or otherwise. In one embodiment, multiple servers 160 may be utilized to process the functions of the system 100. The server 160 and other devices in the system 100, may utilize the database 155 for storing data about the devices in the system 100 or any other information that is associated with the system 100. In one embodiment, multiple databases 155 may be utilized to store data in the system 100.

Although FIG. 1 illustrates specific example configurations of the various components of the system 100, the system 100 may include any configuration of the components, which may include using a greater or lesser number of the components. For example, the system 100 is illustratively shown as including a first user device 102, a second user device 116, a communications network 135, a server 140, a server 150, a server 160, and a database 155. However, the system 100 may include multiple first user devices 102, multiple second user devices 116, multiple communications networks 135, multiple servers 140, multiple servers 150, multiple servers 160, multiple databases 155, or any number of any of the other components inside or outside the system 100. Furthermore, in certain embodiments, substantial portions of the functionality and operations of the system 100 may be performed by other networks and systems that may be connected to system 100.

Figure 13:
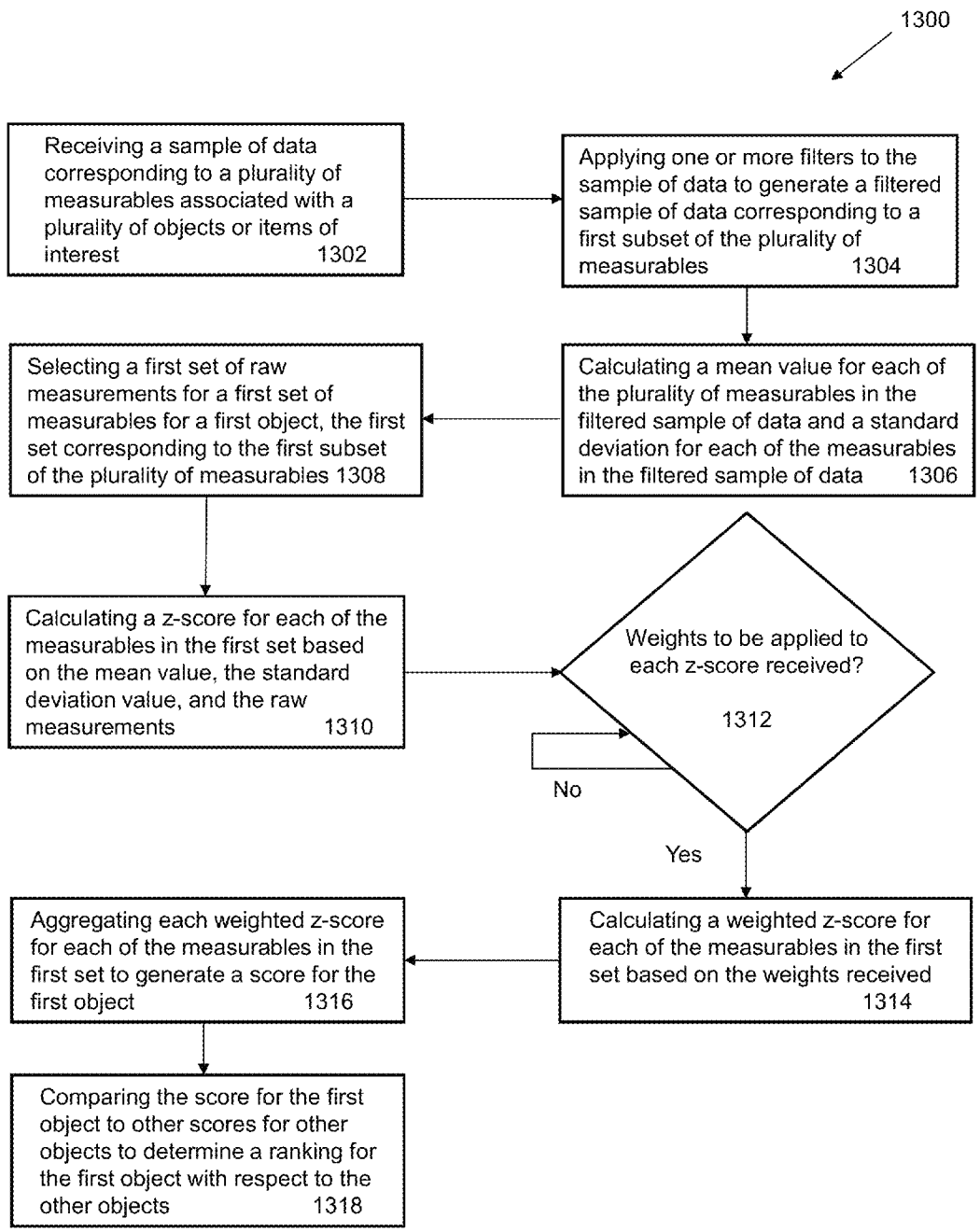
FIG. 13 is a flow diagram illustrating a sample method for providing customizable data aggregating, data sorting, and data transformation according to an embodiment of the present disclosure.

As shown in FIG. 13, an exemplary method 1300 for providing customizable data aggregating, data sorting, and data transformation is schematically illustrated. The method 1300 may include, at step 1302, receiving, via an interface of an application, a sample of data based on a plurality of inputs corresponding to measurement data corresponding to a plurality of measurables associated with a plurality of objects, persons, or items of interest. For example, the measurables may correspond with exercises or events that an athlete participates in during a combine event. The exercises may include, but are not limited to, a 40 yard dash, a 5-10-5 drill, a 3-Cone drill, a vertical jump, a broad jump, or any other exercises. In certain embodiments, the inputs may be received by utilizing the first user device 102, the second user device 116, the server 140, the server 150, the server 160, the communications network 135, any combination thereof, or by utilizing any other appropriate program, network, system, or device. Ate step 1304, the method 1300 may include applying one or more filters to the sample of data to generate a filtered sample of data corresponding to a first subset of the plurality of measurables. The filters may be attributes that may be utilized to a narrow the sample of data down to filtered data samples. The filters, for example, may be filters to require at least a certain height, weight, school, graduation year, bench press repetition count, vertical jump height, broad jump length, SSAT score range, z-score range, weighted-z-score range, any other filter, or any combination thereof. In certain embodiments, the application of the filters may be performed by utilizing the first user device 102, the second user device 116, the server 140, the server 150, the server 160, the communications network 135, any combination thereof, or by utilizing any other appropriate program, network, system, or device.

At step 1306, the method 1300 may include calculating a mean value for each of the plurality of measurables in the filtered sample of data and a standard deviation value for each of the measurables in the filtered sample of data. The mean value may be the average value of the measurements for the plurality of measurables in the filtered sample of data. The standard deviation may be the calculated standard deviation for the measurements in the filtered sample of data. In certain embodiments, the calculating may be performed by utilizing the first user device 102, the second user device 116, the server 140, the server 150, the server 160, the communications network 135, any combination thereof, or by utilizing any other appropriate program, network, system, or device. Once the mean value and the standard deviation value for each of the measurables is calculated and determined, the method 1300 may include, at step 1308, selecting a first set of raw measurements for a first set of measurables for a first object, person, or item of interest. The types of measurables in the first set of measurables may be correspond with the first subset of the plurality of measurables from step 1304. In certain embodiments, the selecting may be performed by utilizing the first user device 102, the second user device 116, the server 140, the server 150, the server 160, the communications network 135, any combination thereof, or by utilizing any other appropriate program, network, system, or device.

At step 1310, the method 1300 may include calculating a z-score for each of the measurables in the first set based on the mean value, the standard deviation value, and the raw measurement value for a particular measurable. The z-score may be computed based on the following equation: z-score=$(x-\mu)/\sigma$, where $x$ is the raw measurement value, $\mu$ is the mean value, and $\sigma$ is the standard deviation value. In certain embodiments, the z-score may be calculated by utilizing the first user device 102, the second user device 116, the server 140, the server 150, the server 160, the communications network 135, any combination thereof, or by utilizing any other appropriate program, network, system, or device. At step 1312, the method 1300 may include determining if any weights to be applied to the z-scores have been received. If weights have not been received, the method 1300 may revert back to step 1312 until weights are received. In certain embodiments, if no weights are received, the method 1300 may proceed to step 1318 and aggregate the z-scores to determine a score for the first object with respect to other objects in the filtered sample of data. If, however, weights have been received at step 1312, the method 1300 may proceed to step 1314. At step 1314, method may include calculating a weighted z-score for each of the measurables in the first set of measurables for the first object based on the received weights. For example, if a 30% weight is to be applied to one measurable and a 50% weight is to be applied to another measureable, such weights may be utilized to calculated the weighted z-score for such measurables. In certain embodiments, the calculating of the weighted z-score may be performed by utilizing the first user device 102, the second user device 116, the server 140, the server 150, the server 160, the communications network 135, any combination thereof, or by utilizing any other appropriate program, network, system, or device.

Once the weighted z-scores for each of the measurables in the first set of measurables are determined, the method 1300 may include, at step 1316, aggregating each of the weighted z-scores for each of the measurables in the first set to generate a score, such as a SSAT score described above, for the first object, person, or item of interest. In certain embodiments, aggregating the weighted z-scores may mean adding each of the weighted z-scores together to form the score. In certain embodiments, the aggregating of the weighted z-scores may be performed by utilizing the first user device 102, the second user device 116, the server 140, the server 150, the server 160, the communications network 135, any combination thereof, or by utilizing any other appropriate program, network, system, or device. At step 1318, the method 1300 may include comparing the generated score for the first object, person, or item of interest to other scores generated for other objects, persons, or items of interest from the filtered sample of data. Based on the comparison of the scores, a ranking for the first object, person, or item of interest may be determined with respect to the other objects, persons, or items of interest. In certain embodiments, comparing and the determination of the ranking may be performed by utilizing the first user device 102, the second user device 116, the server 140, the server 150, the server 160, the communications network 135, any combination thereof, or by utilizing any other appropriate program, network, system, or device. Notably, the method 1300 may further incorporate any of the features and functionality described for the system 100 or as otherwise described herein.

The systems and methods disclosed herein may include additional functionality and features. For example, the operative functions of the system 100 and method may be configured to execute on a special-purpose processor specifically configured to carry out the operations provided by the system 100 and method. Additionally, the system 100 and method is not limited to working with athletic data and providing rankings for athletes. For example, the system 100 and methods may be utilized to provides scores and rankings relating to the performance of computing devices. The measurables in such a scenario may correspond with a bandwidth of the computing devices, an upload rate for an internet connection associated with the computing devices, a download rate for an internet connection associated with the computing devices, a processing speed of processors of the computing devices, a memory speed of the computing devices, or any possible measurable associated with computing devices. The formulas and operative features of the system 100 may be utilized to process raw data received for computing devices being analyzed in a sample, calculate z-scores for selected computing devices, calculate weighted z-scores based on selected weights given for the measurables, and calculate scores of the computing devices based on aggregating the weighted z-scores.

Notably, the system 100 and methods may be utilized in any industry for analyzing the performance of any object, person, or item of interest. For example, the system 100 and methods may be utilized to determine the performance of pharmaceutical drugs, different types of diets, the performance of employees at a particular workplace, the performance of a stock portfolio, the performance of companies, any other type of performance, or any combination thereof. Notably, the functionality and features provided by the system 100 and method may serve to increase the efficiency of computing devices executing the software to provide such functionality and features. For example, through the use of the filters, z-scores, and SSAT scores, databases 155 may need to be accessed less frequently by the processors and memories of the system 100 than previously existing technologies, less processing power needs to be utilized because fewer database records need to be processed, and less memory needs to be utilized. As a result, there are substantial savings in the usage of computer resources by utilizing the software and algorithms provided in the present disclosure as compared with previously existing technologies.

In certain embodiments, X1-X5 may be raw scores, $\mu$ may be a mean value, SD may be the standard deviation, and a z-score may be represented by $(((X1-\mu/SD)*(-1))*$ (weight)), the aggregated standardized score may be represented by $(((X1-\mu/SD)*(-1))*$ (weight))+$(((X2-\mu/SD)*(-1))*$ (weight)) * $(((X3-\mu/SD)*(-1))*$ (weight)) * $(((X4-\mu/SD)*(-1))*$ (weight)) * $(((X5-\mu/SD)*(-1))*$ (weight)), and the aggregated standardized score scale conversion=$((X1-OldMin)*$ (NewMax-NewMin))/(OldMax-OldMin))+ NewMin. Notably, the means ($\mu$) may be adjusted by users in order to compare new scores against different classes.

In certain embodiments, the system 100 and methods the mean and standard deviation may be calculated for each position group of a particular sport, such as quarterbacks, running backs, wide receivers, and the like. Raw data for measurables for each position group may be transformed into a 0-100 scale. The 0-100 scale may be converted to a percentile rank, which will represent the SSAT for that particular measurable. The raw score may be divided by the system's 100 determined fixed maximum and converted to a percentage. The system 100 and methods may include calculating the z-score for each player across each measurable. A coach, for example, can select weights for each measurable, which apply to z-scores in order to expand the statistical distance between the z-scores. The system 100 and methods may then proceed to determine weighted (adjusted) z-score, which may then be aggregated by addition in to a single index z-score. The z-score index may then be converted into a percentile ranking, which may represent the final and overall SSAT score. In certain embodiments, the z-score index may be divided by a determined fixed maximum and converted into a percentage. A coach or other individual may adjust which filters, such as graduation year, etc., they wish to analyze.

Notably, functions and features of the system 100 and methods may operate without human intervention and may be conducted entirely by computing devices, which may continuously update the data in the system and scores calculated as new raw scores are input in the system 100. Indeed, in a preferred embodiment, the computing devices of the system 100 may operate continuously and without human intervention to reduce the possibility of errors being introduced into the system 100.

In certain embodiments, the system 100 and methods may also provide effective computing resource management by utilizing the features and functions described in the present disclosure. For example, in certain embodiments, when a filter is applied or is going to be applied to a sample of data, any selected device in the system 100 may transmit a signal to a device processing the data that only a selected amount of computer processor resources may be devoted to the filtration operation, to the calculation operations (e.g. calculation of z-scores, weighted z-scores, and calculation of the SSAT scores), to the comparing operations, to any other operation, or any combination thereof. For example, the signal may indicate how many processor cycles of a processor may be utilized to process the data, and/or indicate a selected amount of processing power that may be devoted to processing the data or any of the operations performed by the system 100. In certain embodiments, a device processing the data may receive a signal instructing the device to use only a cache of the processor of the device to process and store the data instead of utilizing separate memory and storage devices. In certain embodiments, when a filter is applied or is going to be applied to the sample of data, any selected device in the system 100 may transmit a signal to a memory device storing the data that only certain sectors of the memory of the memory device may be utilized during the filtration process or for storing the filtered sample of data. In certain embodiments, any selected device in the system 100 may transmit a signal to a memory device to cause the memory device to only devote a selected amount of memory resources to the sample of data or to the filtration process or to other operations of the system 100. In certain embodiments, the system 100 and methods may also include transmitting signals to processors and memories to only perform the operative functions of the system 100 and methods at times of the day when usage of processing resources and/or memory resources is below a threshold value. In certain embodiments, the system 100 and methods may include transmitting signals to the memory devices utilized in the system 100, which indicate which specific portions/sectors of the memory should be utilized to store the z-scores, weights, weighted z-scores, SSAT scores, or any other data utilized or generated by the system 100. Notably, the signals transmitted to the processors and memories may be utilized to optimize the usage of computing resources while executing the operations conducted by the system 100. This provides distinct improvements over existing technologies.

Figure 14:
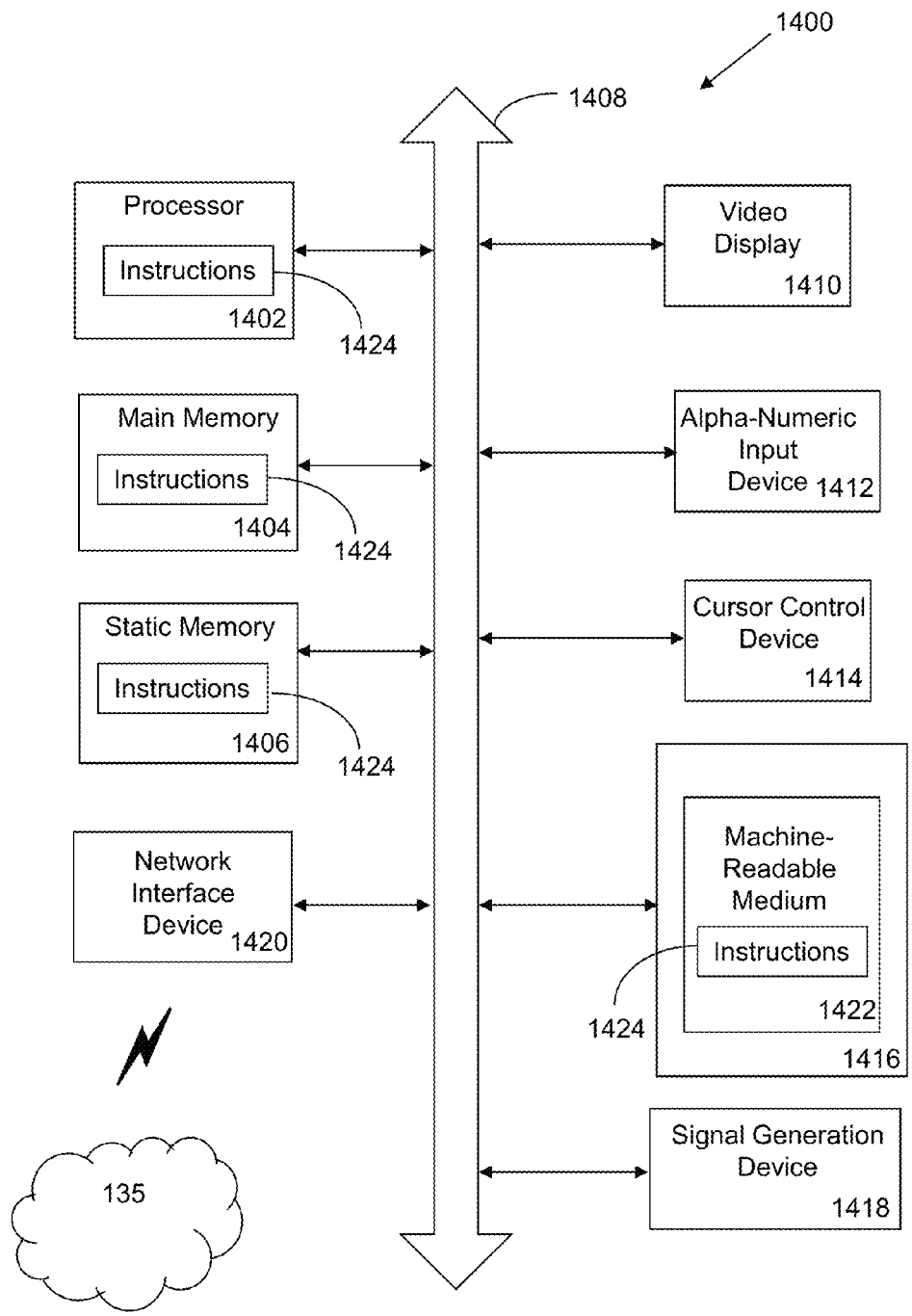
FIG. 14 is a schematic diagram of a machine in the form of a computer system within which a set of instructions, when executed, may cause the machine to perform any one or more of the methodologies or operations of the systems and methods for providing a customizable data aggregating, data sorting, and data transformation system.

Referring now also to FIG. 14, at least a portion of the methodologies and techniques described with respect to the exemplary embodiments of the system 100 can incorporate a machine, such as, but not limited to, computer system 1400, or other computing device within which a set of instructions, when executed, may cause the machine to perform any one or more of the methodologies or functions discussed above. The machine may be configured to facilitate various operations conducted by the system 100. For example, the machine may be configured to, but is not limited to, assist the system 100 by providing processing power to assist with processing loads experienced in the system 100, by providing storage capacity for storing instructions or data traversing the system 100, or by assisting with any other operations conducted by or within the system 100.

In some embodiments, the machine may operate as a standalone device. In some embodiments, the machine may be connected (e.g., using communications network 135, another network, or a combination thereof) to and assist with operations performed by other machines and systems, such as, but not limited to, the first user device 102, the second user device 106, the server 140, the server 150, the database 155, the server 160, or any combination thereof. The machine may be connected with any component in the system 100. In a networked deployment, the machine may operate in the capacity of a server or a client user machine in a server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 1400 may include a processor 1402 (e.g., a central processing unit (CPU), a graphics processing unit (GPU, or both), a main memory 1404 and a static memory 1406, which communicate with each other via a bus 1408. The computer system 1400 may further include a video display unit 1410, which may be, but is not limited to, a liquid crystal display (LCD), a flat panel, a solid state display, or a cathode ray tube (CRT). The computer system 1400 may include an input device 1412, such as, but not limited to, a keyboard, a cursor control device 1414, such as, but not limited to, a mouse, a disk drive unit 1416, a signal generation device 1418, such as, but not limited to, a speaker or remote control, and a network interface device 1420.

The disk drive unit 1416 may include a machine-readable medium 1422 on which is stored one or more sets of instructions 1424, such as, but not limited to, software embodying any one or more of the methodologies or functions described herein, including those methods illustrated above. The instructions 1424 may also reside, completely or at least partially, within the main memory 1404, the static memory 1406, or within the processor 1402, or a combination thereof, during execution thereof by the computer system 1400. The main memory 1404 and the processor 1402 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine-readable medium 1422 containing instructions 1424 so that a device connected to the communications network 135, another network, or a combination thereof, can send or receive voice, video or data, and communicate over the communications network 135, another network, or a combination thereof, using the instructions. The instructions 1424 may further be transmitted or received over the communications network 135, another network, or a combination thereof, via the network interface device 1420.

While the machine-readable medium 1422 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that causes the machine to perform any one or more of the methodologies of the present disclosure.

The terms "machine-readable medium," "machine-readable device," or "computer-readable device" shall accordingly be taken to include, but not be limited to: memory devices, solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. The "machine-readable medium," "machine-readable device," or "computer-readable device" may be non-transitory, and, in certain embodiments, may not include a wave or signal per se. Accordingly, the disclosure is considered to include any one or more of a machine-readable medium or a distribution medium, as listed herein and including art-recognized equivalents and successor media, in which the software implementations herein are stored.

The illustrations of arrangements described herein are intended to provide a general understanding of the structure of various embodiments, and they are not intended to serve as a complete description of all the elements and features of apparatus and systems that might make use of the structures described herein. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The foregoing is provided for purposes of illustrating, explaining, and describing embodiments of this invention. Modifications and adaptations to these embodiments will be apparent to those skilled in the art and may be made without departing from the scope or spirit of this invention. Upon reviewing the aforementioned embodiments, it would be evident to an artisan with ordinary skill in the art that said embodiments can be modified, reduced, or enhanced without departing from the scope and spirit of the claims described below.

We claim:

1. A system, comprising:
   a memory that stores instructions; and
   a processor that executes the instructions to perform operations, the operations comprising:
      applying a first filter to a sample of data corresponding to a plurality of measurable actions performed by a plurality of objects to generate a first filtered sample of data corresponding to a first subset of the plurality of measurable actions;
      calculating a mean value for each of the plurality of measurable actions in the first filtered sample of data and a standard deviation value for each of the plurality of measurable actions in the first filtered sample of data;
      selecting a first set of raw measurements for a first set of measurable actions for a first object of the plurality of objects, wherein the first set of measurable actions correspond to the first subset of the plurality of measureable actions;
      calculating a z-score for each of the measurable actions in the first set of measurable actions, wherein the z-score is calculated based on the mean value, the standard deviation value, and the first set of raw measurements;
      calculating, based on a weight to be applied to each z-score for each of the measurable actions in the first set of measurable actions, a weighted z-score for each of the measureable actions in the first set of measurable actions;
      aggregating each weighted z-score for each of the measurable actions in the first set of measurable actions to generate a first score for the first object; and
      comparing the first score for the first object to other scores for other objects in the plurality of objects to determine a ranking for the first object with respect to the other objects.

2. The system of claim 1, wherein the operations further comprise receiving, via an application executing in the system, the weight to be applied to each z-score for each of the measurable actions in the first set of measurable actions.

3. The system of claim 1, wherein the operations further comprise applying a second filter to the sample of data to generate a second filtered sample of data corresponding to a second subset of the plurality of measurable actions.

4. The system of claim 3, wherein the operations further comprise calculating a mean value for each of the plurality of measurable actions in the second filtered sample of data and a standard deviation value for each of the plurality of measurable actions in the second filtered sample of data.

5. The system of claim 4, wherein the operations further comprise selecting a second set of raw measurements for a second set of measurable actions for a second object of the plurality of objects, wherein the second set of measurable actions correspond to the second subset of the plurality of measureable actions.

6. The system of claim 5, wherein the operations further comprise calculating a z-score for each of the measurable actions in the second set of measurable actions, wherein the z-score for each of the measureable actions in the second set of measurable actions is calculated based on the mean value for each of the plurality of measurable actions in the second filtered sample of data, the standard deviation value for each of the plurality of measurable actions in the second filtered sample of data, and the second set of raw measurements.

7. The system of claim 6, wherein the operations further comprise calculating, based on a weight to be applied to each z-score for each of the measurable actions in the second set of measurable actions, a weighted z-score for each of the measureable actions in the second set of measurable action.

8. The system of claim 7, wherein the operations further comprise aggregating each weighted z-score for each of the measurable actions in the second set of measurable actions to generate a second score for the second object, and determining a ranking for the second object.

9. The system of claim 1, wherein the operations further comprise adjusting the weight to be applied to each z-score for each of the measurable actions in the first set of measurable actions.

10. The system of claim 9, wherein the operations further comprise adjusting the first score for the first object based on the adjusted weight.

11. The system of claim 1, wherein the plurality of measurable actions performed by the plurality of objects comprise physical exercises, computer operations, activities, any measurable action, or any combination thereof.

12. The system of claim 1, wherein the operations further comprise displaying, via a graphical user interface of an application executing in the system, the ranking for the first object and rankings for the other objects.

13. The system of claim 1, wherein the operations further comprise converting the first score into a percentile ranking for the first object.

14. A method, comprising:
applying, by utilizing instructions from a memory that are executed by a processor, a first filter to a sample of data corresponding to a plurality of measurable actions performed by a plurality of objects to generate a first filtered sample of data corresponding to a first subset of the plurality of measurable actions;
calculating a mean value for each of the plurality of measurable actions in the first filtered sample of data and a standard deviation value for each of the plurality of measurable actions in the first filtered sample of data;
selecting a first set of raw measurements for a first set of measurable actions for a first object of the plurality of objects, wherein the first set of measurable actions correspond to the first subset of the plurality of measureable actions;
calculating a z-score for each of the measurable actions in the first set of measurable actions, wherein the z-score is calculated based on the mean value, the standard deviation value, and the first set of raw measurements;
calculating, based on a weight to be applied to each z-score for each of the measurable actions in the first set of measurable actions, a weighted z-score for each of the measureable actions in the first set of measurable actions;
aggregating each weighted z-score for each of the measurable actions in the first set of measurable actions to generate a first score for the first object; and
comparing the first score for the first object to other scores for other objects in the plurality of objects to determine a ranking for the first object with respect to the other objects.

15. The method of claim 14, further comprising calculating a z-score for all objects associated with the first filtered sample of data.

16. The method of claim 15, further comprising adjusting the ranking for the first object as additional raw measurements are received for the first set of measureable actions for the first object over time.

17. The method of claim 14, further comprising adjusting the weight to be applied to each z-score for each of the measurable actions in the first set of measurable actions.

18. The method of claim 17, further comprising calculating, based on the adjusted weight, an adjusted weighted z-score for each of the measureable actions in the first set of measurable actions.

19. The method of claim 18, further comprising adjusting the first score based on the adjusted weighted z-score for each of the measureable actions in the first set of measurable actions.

20. A computer-readable device comprising instructions, which when loaded and executed by a processor, cause the processor to perform operations comprising:
applying a first filter to a sample of data corresponding to a plurality of measurable actions performed by a plurality of objects to generate a first filtered sample of data corresponding to a first subset of the plurality of measurable actions;
calculating a mean value for each of the plurality of measurable actions in the first filtered sample of data and a standard deviation value for each of the plurality of measureable actions in the first filtered sample of data;
selecting a first set of raw measurements for a first set of measurable actions for a first object of the plurality of objects, wherein the first set of measurable actions correspond to the first subset of the plurality of measureable actions;
calculating a z-score for each of the measurable actions in the first set of measurable actions, wherein the z-score is calculated based on the mean value, the standard deviation value, and the first set of raw measurements;
calculating, based on a weight to be applied to each z-score for each of the measurable actions in the first set of measurable actions, a weighted z-score for each of the measureable actions in the first set of measurable actions;
aggregating each weighted z-score for each of the measurable actions in the first set of measurable actions to generate a first score for the first object; and
comparing the first score for the first object to other scores for other objects in the plurality of objects to determine a ranking for the first object with respect to the other objects.

* * * * *